(12) United States Patent
Tokioka et al.

(10) Patent No.: US 7,791,073 B2
(45) Date of Patent: Sep. 7, 2010

(54) THIN FILM TRANSISTOR

(75) Inventors: Hidetada Tokioka, Tokyo (JP); Naoki Nakagawa, Tokyo (JP); Masafumi Agari, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 220 days.

(21) Appl. No.: 11/734,390

(22) Filed: Apr. 12, 2007

(65) Prior Publication Data

US 2007/0241336 A1 Oct. 18, 2007

(30) Foreign Application Priority Data

Apr. 18, 2006 (JP) .............................. 2006-114014

(51) Int. Cl.
*H01L 31/20* (2006.01)
(52) U.S. Cl. ............................ 257/59; 257/72; 257/351; 257/E29.291; 257/E29.284
(58) Field of Classification Search ................... 257/59, 257/E29.291, 72, 351, E29.284
See application file for complete search history.

(56) References Cited

U.S. PATENT DOCUMENTS

| | | | |
|---|---|---|---|
| 5,760,652 A * | 6/1998 | Maemura et al. ............ | 330/297 |
| 6,445,216 B1 * | 9/2002 | Bruneau et al. ............... | 327/52 |
| 6,884,698 B1 * | 4/2005 | Ohtani et al. ................ | 438/486 |
| 7,002,178 B2 | 2/2006 | Chung | |
| 2001/0030574 A1 * | 10/2001 | Takai .......................... | 327/563 |
| 2002/0027256 A1 * | 3/2002 | Ishibashi et al. ............. | 257/391 |
| 2003/0070147 A1 * | 4/2003 | Friend et al. .................... | 716/2 |
| 2004/0063257 A1 * | 4/2004 | Zhang et al. ................. | 438/154 |
| 2005/0062047 A1 | 3/2005 | Nishikawa et al. | |
| 2005/0236970 A1 * | 10/2005 | Matsudate et al. .......... | 313/500 |

FOREIGN PATENT DOCUMENTS

| | | |
|---|---|---|
| JP | 5-289103 | 11/1993 |
| JP | 09-082969 | 3/1997 |
| JP | 9-82969 | 3/1997 |
| JP | 2003-519917 | 6/2003 |
| JP | 2005-259780 | 9/2005 |
| KR | 2003-81992 | 10/2003 |
| KR | 2005-29709 | 3/2005 |

* cited by examiner

*Primary Examiner*—Tu-Tu V Ho
(74) *Attorney, Agent, or Firm*—Oblon, Spivak, McClelland, Maier & Neustadt, L.L.P.

(57) ABSTRACT

In first and second gate electrodes constituting a gate electrode, the gate length of the second gate electrode is set shorter than the gate length of the first gate electrode and short enough to produce the short channel effect. The threshold voltage of a second transistor corresponding to the second gate electrode can thereby be made lower than the threshold voltage of a first transistor corresponding to the first gate electrode. When the same voltage is applied to the first and second gate electrodes, an electric field concentration at the channel edge on the drain side is reduced. This in result reduces the channel length modulation effect.

6 Claims, 24 Drawing Sheets

F I G . 5
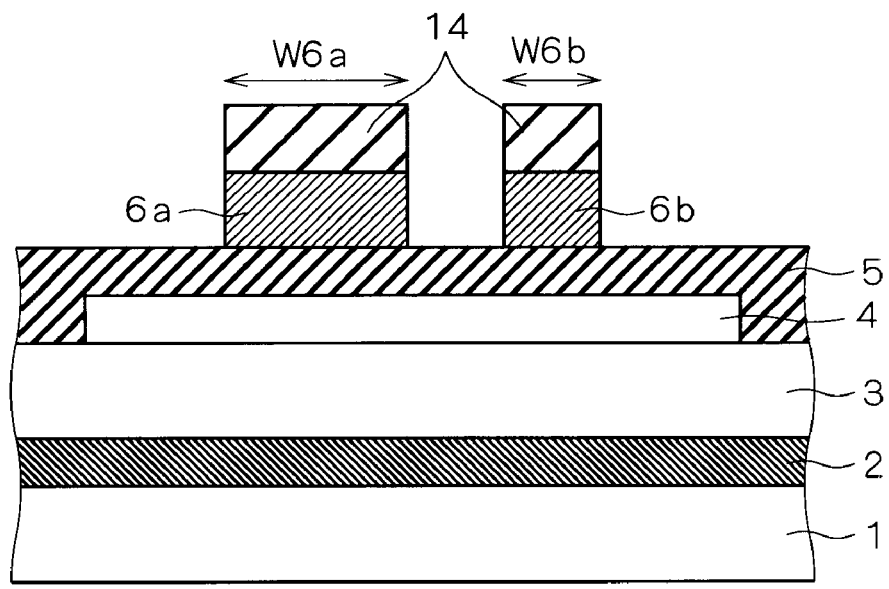
F I G . 6
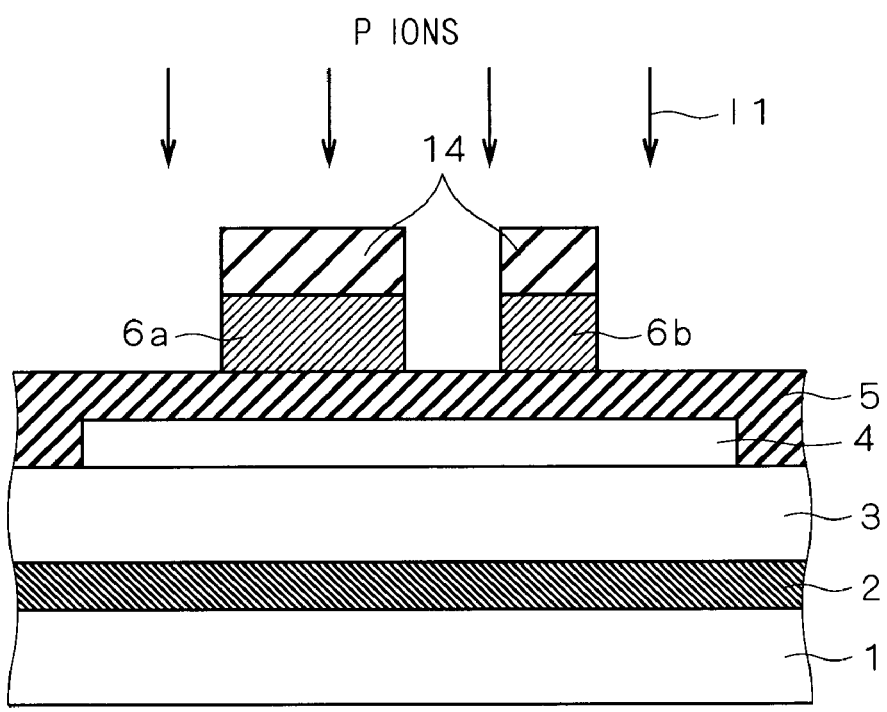

THIN FILM TRANSISTOR

FIELD OF THE INVENTION

The present invention relates to a thin film transistor for use in an analog circuit for a liquid crystal display or an organic EL display.

DESCRIPTION OF THE BACKGROUND ART

In thin film transistors, high electric fields may be formed near the drain, resulting in impact ionization, which increases the drain current. This phenomenon is called the kink effect. National Publication of Translation No. 2003-519917 (WO01/050514) describes a technique of reducing such kink effect.

The above gazette discloses the technique of splitting the gate electrode into a plurality of portions so that carriers are absorbed into a silicon layer between the split portions of the gate electrode, to thereby suppress the kink effect.

The kink effect is indeed suppressed by splitting a gate electrode into a plurality of portions and providing a silicon layer between the split portions of the gate electrode as described in the above gazette; however, the saturation current which affects the quality of analog circuit characteristics is still large. Such increase in saturation current is generally called the channel length modulation effect.

SUMMARY OF THE INVENTION

An object of the present invention is to provide a thin film transistor capable of reducing the kink effect as well as reducing the channel length modulation effect.

According to a first aspect of the invention, the thin film transistor includes a substrate, a semiconductor layer above the substrate, a gate insulating film on a surface of the semiconductor layer, first and second gate electrodes separated from each other on a surface of the gate insulating film, a source region and a drain region in the semiconductor layer at positions between which the first and second gate electrodes are interposed, and an intermediate region in the semiconductor layer interposed between the first and second gate electrodes. The gate insulating film, the first gate electrode, the semiconductor layer, the source region and the intermediate region constitute a first transistor. The gate insulating film, the second gate electrode, the semiconductor layer, the drain region and the intermediate region constitute a second transistor. The second transistor has a threshold voltage lower than a threshold voltage of the first transistor.

The second transistor has a threshold voltage lower than the threshold voltage of the first transistor, which means the threshold voltage on the drain side is lower. When the same voltage is applied to the first and second gate electrodes, the on-state resistance at the channel in the semiconductor layer under the second gate electrode is thus sufficiently low, which reduces an electric field concentration at the channel edge on the drain side. This in result suppresses the occurrence of kink current due to an electric field concentration. The suppression of an electric field concentration also contributes to a reduction of the channel length modulation effect, which in result also suppresses fluctuations in saturation current with respect to the drain voltage. A thin film transistor capable of reducing the channel length modulation effect is thereby obtained.

According to a second aspect of the invention, the thin film transistor includes a substrate, first and second gate electrodes separated from each other on a surface of the substrate, a gate insulating film on a surface of the substrate and surfaces of the first and second gate electrodes, a semiconductor layer on a surface of the gate insulating film, a source region and a drain region in a surface of the semiconductor layer at positions between which the first and second gate electrodes are interposed, and an intermediate region in the surface of the semiconductor layer interposed between the first and second gate electrodes. The gate insulating film, the first gate electrode, the semiconductor layer, the source region and the intermediate region constitute a first transistor. The gate insulating film, the second gate electrode, the semiconductor layer, the drain region and the intermediate region constitute a second transistor. The second transistor has a threshold voltage lower than a threshold voltage of the first transistor.

The second transistor has a threshold voltage lower than the threshold voltage of the first transistor, which means the threshold voltage on the drain side is lower. When the same voltage is applied to the first and second gate electrodes, the on-state resistance at the channel in the semiconductor layer above the second gate electrode is sufficiently low, which reduces an electric field concentration at the channel edge on the drain side. This in result suppresses the occurrence of kink current due to an electric field concentration. The suppression of an electric field concentration also contributes to a reduction of the channel length modulation effect, which in result also suppresses fluctuations in saturation current with respect to the drain voltage. A thin film transistor capable of reducing the channel length modulation effect is thereby obtained.

According to a third aspect of the invention, the thin film transistor includes a substrate, a semiconductor layer above the substrate, a gate insulating film on a surface of the semiconductor layer, a gate electrode on a surface of the gate insulating film, a source region and a drain region in the semiconductor layer at positions between which the first and second gate electrodes are interposed, a first portion under the gate electrode in the semiconductor layer positioned closer to the source region, and a second portion under the gate electrode in the semiconductor layer positioned closer to the drain region. The second portion has an impurity concentration higher than an impurity concentration of the first portion.

The second portion positioned closer to the source region in the semiconductor layer has an impurity concentration higher than the impurity concentration of the first portion positioned closer to the drain region in the semiconductor layer. Since the threshold voltage on the drain side is thus lower, the on-state resistance at the channel in the semiconductor layer under the second gate electrode is sufficiently low when the same voltage is applied to the first and second gate electrodes, which reduces an electric field concentration at the channel edge on the drain side. This in result suppresses the occurrence of kink current due to an electric field concentration. The suppression of an electric field concentration also contributes to a reduction of the channel length modulation effect, which in result also suppresses fluctuations in saturation current with respect to the drain voltage. A thin film transistor capable of reducing the channel length modulation effect is thereby obtained.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 through 8 are diagrams each showing a step of the method of manufacturing the thin film transistor according to the first preferred embodiment;

DESCRIPTION OF THE PREFERRED EMBODIMENTS

First Preferred Embodiment

The present embodiment will describe a thin film transistor including first and second transistors with first and second gate electrodes provided separately from each other on the surface of a gate insulating film. The thin film transistor is intended to reduce an electric field concentration at the channel edge on the drain side by setting the threshold voltage of the second transistor lower than that of the first transistor.

Figure 1:
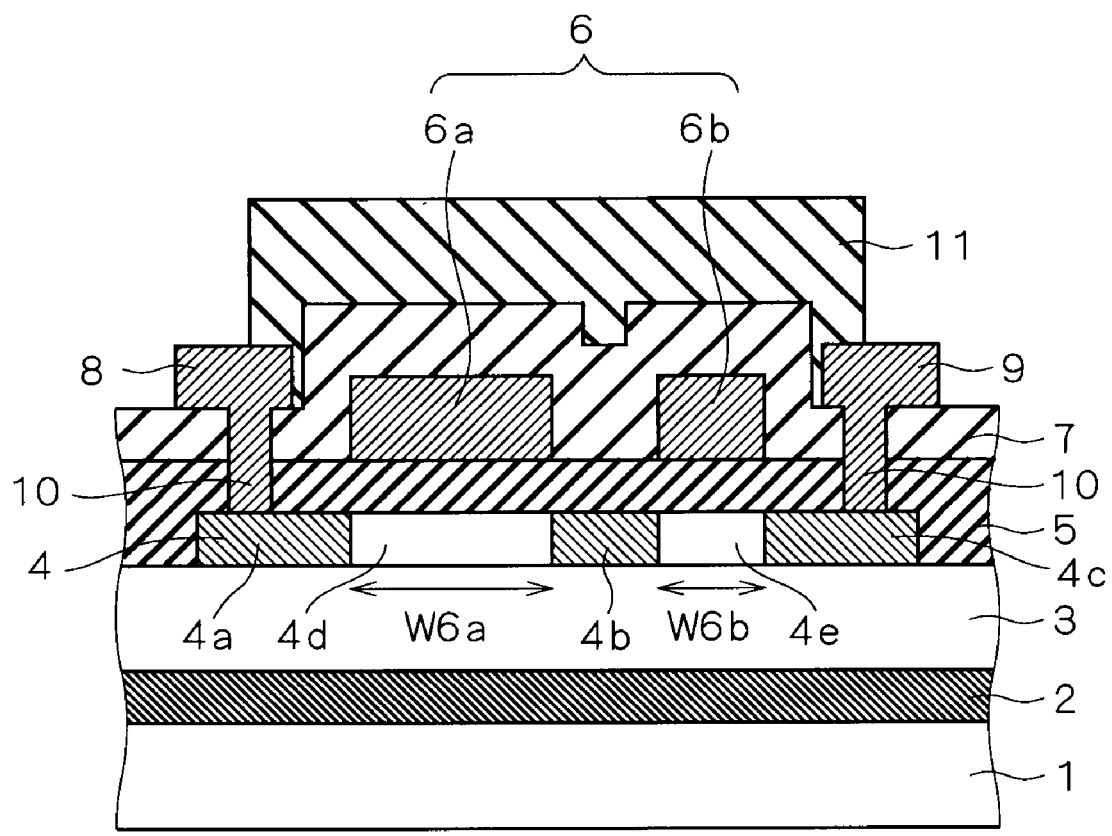
FIG. 1 is a sectional view showing a thin film transistor according to a first preferred embodiment.

FIG. 1 is a sectional view showing the thin film transistor according to the present embodiment. The thin film transistor includes a glass substrate 1. A 100-nm thick silicon nitride (SiN) film 2 and a 200-nm thick silicon oxide ($SiO_2$) film 3 are formed on the glass substrate 1.

A polycrystalline silicon (polysilicon) film 4 is formed like islands on the silicon oxide film 3. That is, the polysilicon film 4 is a semiconductor layer formed above the glass substrate 1. Formed on the surfaces of the polysilicon film 4 and silicon oxide film 3 is a silicon oxide ($SiO_2$) film 5 serving as a gate insulating film.

A first gate electrode 6a and a second gate electrode 6b, each being made of a chromium (Cr) film, are formed separately from each other on the surface of the silicon oxide film 5. Although not illustrated, the first gate electrode 6a and second gate electrode 6b are electrically connected to each other in an area except above the polysilicon film 4 in a different section from that shown in FIG. 1.

The polysilicon film 4 includes a source region 4a and a drain region 4c, each being a doped active region, provided in positions between which the first and second gate electrodes 6a and 6b are interposed. The polysilicon film 4 also includes an intermediate region 4b being a doped region interposed between the first and second gate electrodes 6a and 6b. The polysilicon film 4 further includes a portion 4d under the first gate electrode 6a and a portion 4e under the second gate electrode 6b, each serving as the transistor body.

Formed on the first and second gate electrodes 6a, 6b and silicon oxide film 5 is a silicon oxide film 7 serving as an interlayer insulating film. Contact holes 10 are provided to extend through the silicon oxide films 5 and 7 to reach the source region 4a and drain region 4c, respectively. A source electrode 8 and a drain electrode 9, each being made of an aluminum (Al) film, are formed on the silicon oxide film 7.

The source electrode 8 and drain electrode 9 are connected to the source region 4a and drain region 4c via plugs in the contact holes 10, respectively. A silicon nitride film 11 serving as a surface protecting film is formed on the silicon oxide film 7 to cover the surface of the silicon oxide film 7 except the area where the source electrode 8 and drain electrode 9 are provided.

Since the first gate electrode 6a and second gate electrode 6b are electrically connected to each other in the area except above the polysilicon film 4 as described above, they may be considered to constitute one gate electrode 6 split into two. Then, the source region 4a and drain region 4c may be considered as the source region and drain region of the one gate electrode 6, respectively.

In other words, since the gate electrode 6 is split into the first gate electrode 6a and second gate electrode 6b, the silicon oxide film 5 serving as a gate insulating film, first gate electrode 6a, body 4d, source region 4a and intermediate region 4b may be considered to constitute the first transistor, while the silicon oxide film 5, second gate electrode 6b, body 4e, drain region 4c and intermediate region 4b may be considered to constitute the second transistor. In the first transistor, the source region 4a and intermediate region 4b may be considered to correspond to the source region and drain region of the first gate electrode 6a, respectively. In the second transistor, the drain region 4c and intermediate region 4b may be considered to correspond to the drain region and source region of the second gate electrode 6b, respectively.

In the present embodiment, a gate length W6b of the second gate electrode 6b along the line connecting the source region 4a and drain region 4c is set shorter than a gate length W6a of the first gate electrode 6a along the line connecting the source region 4a and drain region 4c. Further, in the present embodiment, the gate length W6b of the second gate electrode 6b is set short enough to produce the short channel effect. Herein, the short channel effect indicates the phenomenon that the transistor threshold decreases as the channel length decreases.

In this manner, by setting the gate length W6b of the second gate electrode 6b shorter than the gate length W6a of the first gate electrode 6a and short enough to produce the short channel effect, the threshold voltage Vthb of the second transistor corresponding to the second gate electrode 6b can easily be made lower than the threshold voltage Vtha of the first transistor corresponding to the first gate electrode 6a.

When setting the threshold voltage Vthb of the second transistor lower than the threshold voltage Vtha of the first transistor, which means the threshold voltage on the drain side is lower, the on-state resistance at the channel (the surface of the body 4e) in the semiconductor layer (polysilicon film 4) under the second gate electrode 6b is sufficiently low when the same voltage is applied to the first and second gate electrodes 6a and 6b, resulting in a reduction of an electric field concentration at the channel edge on the drain side. This in turn suppresses the occurrence of kink current due to an electric field concentration. The suppression of an electric field concentration also contributes to a reduction of the channel length modulation effect, which in result also reduces fluctuations in saturation current with respect to the drain voltage. A thin film transistor capable of reducing the channel length modulation effect is thereby obtained. These effects will be described later in detail.

The method of manufacturing the thin film transistor shown in FIG. 1 will now be described. FIGS. 2 through 8 are diagrams each showing a step of the method of manufacturing the thin film transistor according to the present embodiment.

Figure 2:
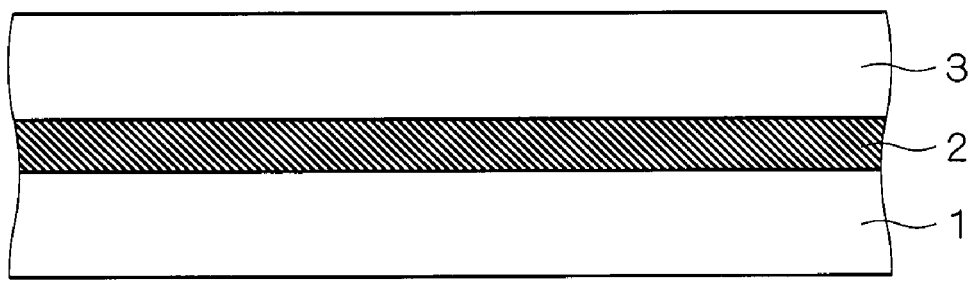

First, as shown in FIG. 2, the silicon nitride film 2 and silicon oxide film 3 are grown in this order on the glass substrate 1, both at least in a thickness of 100 nm, by plasma vapor deposition. After this deposition, heat treatment such as annealing may be carried out for obtaining improved film properties.

Figure 3:
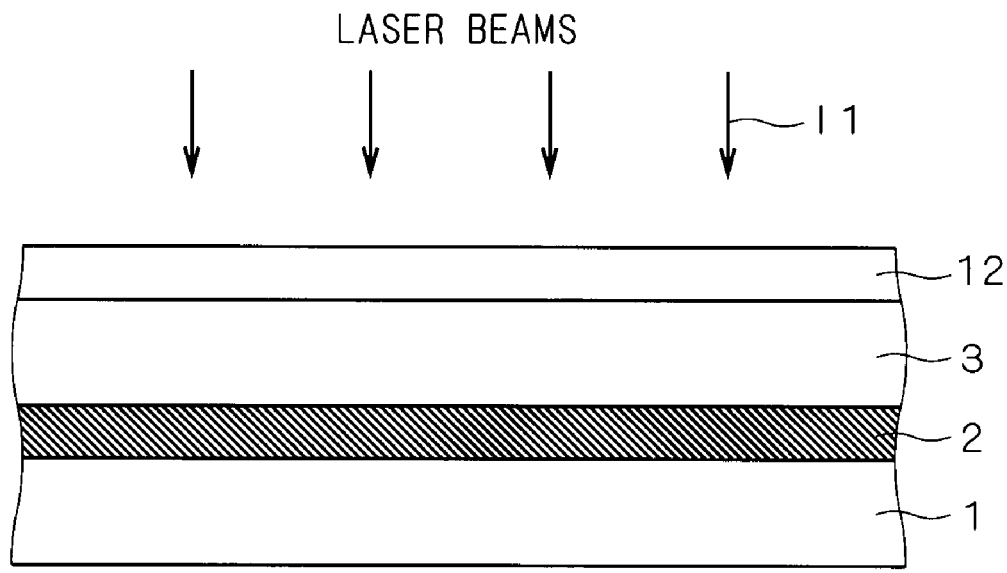

Next, an amorphous silicon film 12 is grown on the silicon oxide film 3 in a thickness of 50 nm by plasma vapor deposition. The deposition may be thermal vapor deposition. Then, as shown in FIG. 3, XeCl excimer laser beams L1 (wavelength: 308 nm) are irradiated to the amorphous silicon film 12. With the irradiation of the laser beams L1, the amorphous silicon film 12 turns into the polysilicon film 4. As a light source of the laser beams L1, the second harmonics (wavelength: 532 nm) of an Nd-doped YAG ($Y_3Al_5O_{12}$) solid pulse laser may be used instead of the XeCl excimer laser beams.

Figure 4:
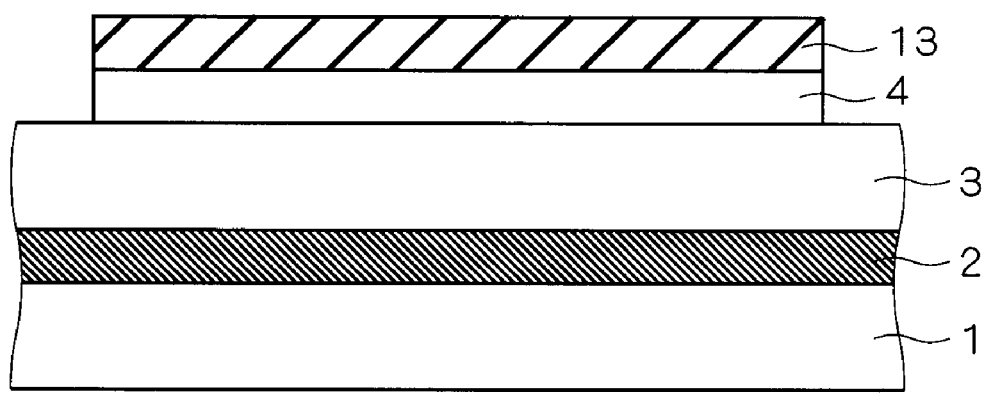

The polysilicon film 4 thus generated is patterned using a resist film 13, and as shown in FIG. 4, etched by dry etching to draw thereon the same configuration as the resist pattern.

Next, the resist film 13 is removed, and the silicon oxide film 5 is grown in a thickness of 100 nm by plasma vapor deposition. After removing the resist film 13, impurities may be introduced into the polysilicon film 4 in order to control the threshold voltage of the thin film transistor. In addition, it is preferable to clean the surface of the polysilicon film 4 with nitric acid, fluoric acid or the like before growing the silicon oxide film 5 in terms of increasing cleanliness of the surface of the polysilicon film 4.

Next, a 200-nm thick chromium film is deposited by sputtering. At this time, a molybdenum film may be used instead of the chromium film. Thereafter, the chromium film is patterned as shown in FIG. 5 using a resist film 14, and etched, to thereby form the first and second gate electrodes 6a and 6b. As already described, the gate length W6b of the second gate electrode 6b is set shorter than the gate length W6a of the first gate electrode 6a and short enough to produce the short channel effect.

Next, as shown in FIG. 6, impurity implantation 11 is carried out by implanting phosphor (P) ions by an ion accelerator into part of the polysilicon film 4 not covered by the resist film 14 while leaving the resist film 14 unremoved. The source region 4a being a doped active region, intermediate region 4b and drain region 4c are thereby formed in the polysilicon film 4. The portion 4d under the first gate electrode 6a in the polysilicon film 4 and the portion 4e under the second gate electrode 6b in the polysilicon film 4 serve as the bodies of the first and second transistors, respectively.

While the first and second transistors are assumed to be n-type transistors in the present embodiment, boron (B) ions are used instead of P ions in the impurity implantation 11 when the first and second transistors are p-type transistors. The method of ion implantation may be selected from among plasma doping, ion shower doping and the like, according to necessity.

Figure 7:
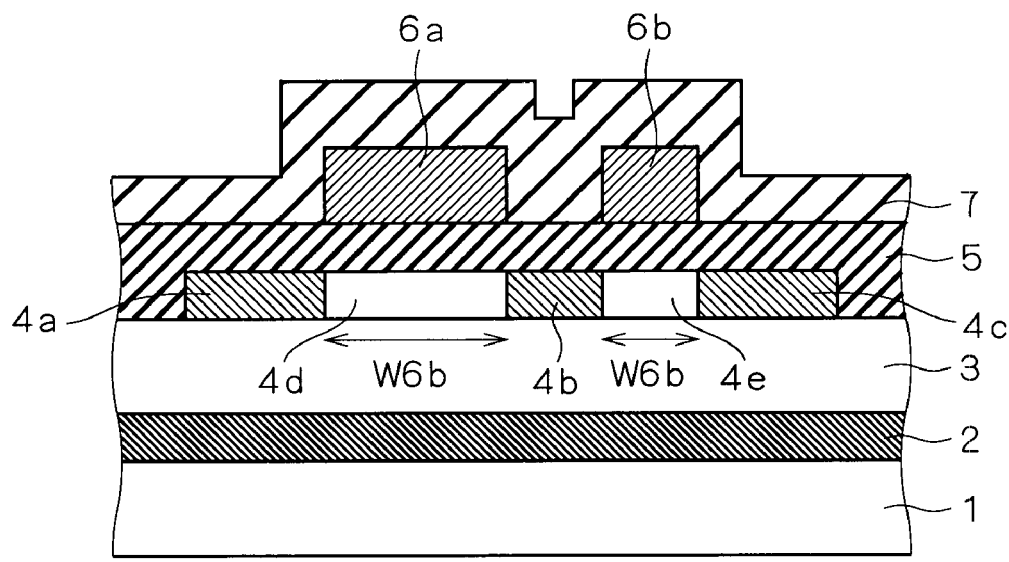

Then, the resist film 14 is removed, and the silicon oxide film 7 is grown in a thickness of 500 nm by plasma vapor deposition as shown in FIG. 7. Thermal annealing is then carried out in order to electrically activate impurity ions as implanted. In the annealing, laser activation may be employed.

Figure 8:
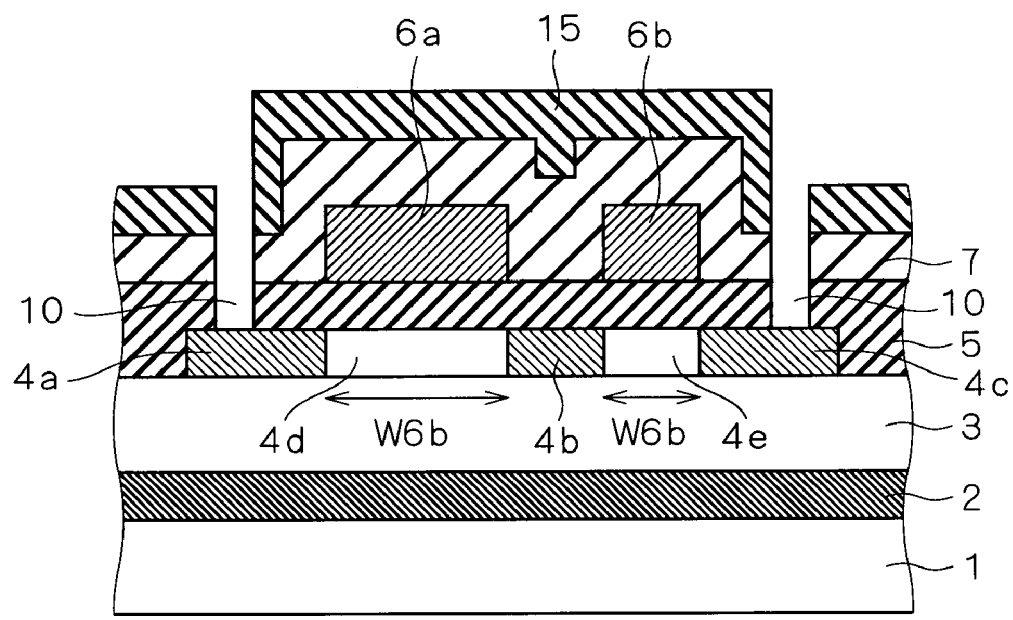

Next, as shown in FIG. 8, a pattern is formed using a resist film 15, and the contact holes 10 are created by etching in the silicon oxide films 5 and 7. At this time, slightly etching the surface of the polysilicon film 4 under the silicon oxide film 5 as well improves the contact properties between the source and drain electrodes which will be described later. The resist film 15 is then removed, and an aluminum film is deposited by sputtering. The aluminum film is patterned using a resist film and etched, to thereby form the source electrode 8 and drain electrode 9.

The resist film is then removed, and the silicon nitride film 11 is grown in a thickness of 200 nm by plasma vapor deposition, and part of the silicon nitride film 11 on the source electrode 8 and drain electrode 9 is removed by etching. Before growing the silicon nitride film 11, the surface of the device structure may be exposed to hydrogen in plasmatic condition in order to correct defects in the polysilicon film 4 to obtain improved electric properties.

The thin film transistor shown in FIG. 1 is manufactured through the above-described steps of the manufacturing method.

As described, in the thin film transistor according to the present embodiment, the threshold voltage Vthb of the second transistor corresponding to the second gate electrode 6b is lower than the threshold voltage Vtha of the first transistor corresponding to the first gate electrode 6a. Other measures to vary the threshold voltage between transistors than making the gate length W6b of the second gate electrode 6b shorter than the gate length W6a of the first gate electrode 6a and short enough to produce the short channel effect is, for example, to make the impurity concentration in the channel of the second transistor higher than that in the channel of the first transistor, as will be described later in a second preferred embodiment.

When operating the thin film transistor according to the present embodiment, a constant voltage is applied to the first and second gate electrodes 6a and 6b. This voltage shall take a value at which a required current conducts to the thin film transistor. With the constant voltage being applied to the gate electrode 6, the source electrode 8 is grounded, and a drain voltage is applied to the drain electrode 9 to detect a current which conducts between the source electrode 8 and drain electrode 9.

When the drain voltage is low, the second transistor corresponding to the second gate electrode 6b presents linear characteristics. The source-to-drain current at the second transistor thus increases as the drain voltage increases. With ideal characteristics, the source-to-drain current is approximated by a quadratic function of drain voltage. As the drain voltage increases further, the operation of the second transistor shifts from a linear region to a saturation region.

In contrast, since the effective voltage applied to the first gate electrode 6a is large, the operation of the first transistor remains in the linear region even when the same voltage as applied to the second gate electrode 6b is applied to the first gate electrode 6a. As the drain voltage increases further, an electric field concentration starts to occur at the drain edge of the second transistor.

In a conventional gate-split-type thin film transistor as described in the above gazette No. 2003-519917, a plurality of transistors corresponding to the respective split portions of the gate do not always differ from one another in threshold voltage. In other words, the threshold voltage Vtha of the first transistor and the threshold voltage Vthb of the second transistor do not always differ from each other in the conventional gate-split-type thin film transistor.

Herein, a drain voltage at which a kink current due to an electric field concentration starts to occur is referred to as Vkink. The threshold voltage Vtha of the first transistor is assumed to be the same as the threshold voltage of the conventional gate-split-type thin film transistor.

In the thin film transistor according to the present embodiment, the relation Vtha>Vthb holds. Thus, an electric field concentration at the drain edge of the second transistor is reduced more than in the conventional transistor even when the drain voltage is at Vkink. This suppresses the occurrence of kink current. The suppression of an electric field concentration also contributes to a reduction of the channel length modulation effect, which in result suppresses fluctuations in saturation current with respect to the drain voltage.

Figure 9:
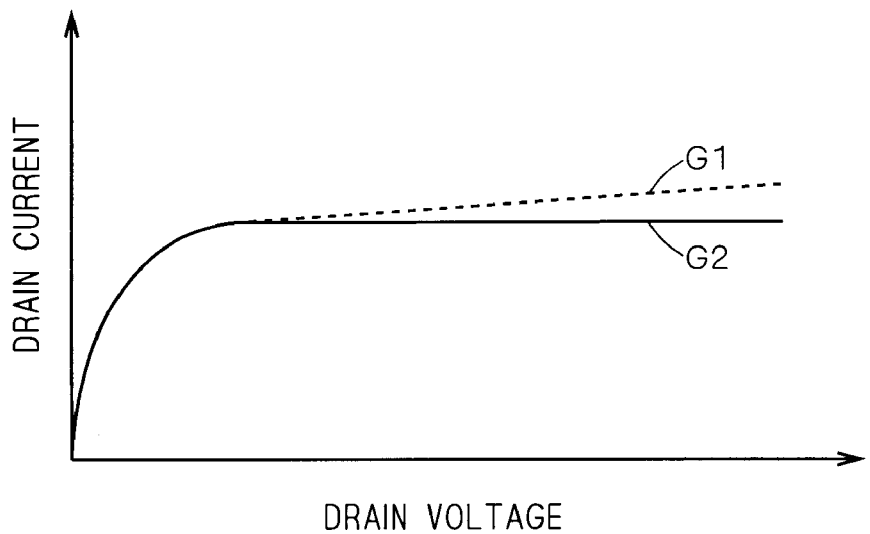
FIG. 9 is a graph showing the effects of the thin film transistor according to the first preferred embodiment.

FIG. 9 is a graph showing the effects of the thin film transistor according to the present embodiment. As indicated by a graph G1, the conventional gate-split-type thin film transistor is capable of reducing the kink effect but incapable of controlling an increase in saturation current due to the channel length modulation effect. In contrast, in the thin film transistor according to the present embodiment, the saturation current has almost constant characteristics with respect to changes in drain voltage, as indicated by a graph G2.

This means that the present invention achieves significant effects that the channel length modulation effect is reduced to make the saturation current almost constant even when the same voltage is applied to the first and second gate electrodes 6a and 6b, because the transistors corresponding to the respective gate electrodes operate in different conditions. A thin film transistor suitable for an analog circuit which operates in a saturation region and the like is thereby achieved.

Second Preferred Embodiment

The present embodiment is a modification of the thin film transistor according to the first preferred embodiment, in which the threshold voltage of the second transistor is set lower than that of the first transistor by making the first and second transistors differ in impurity concentration at the channel.

Figure 10:
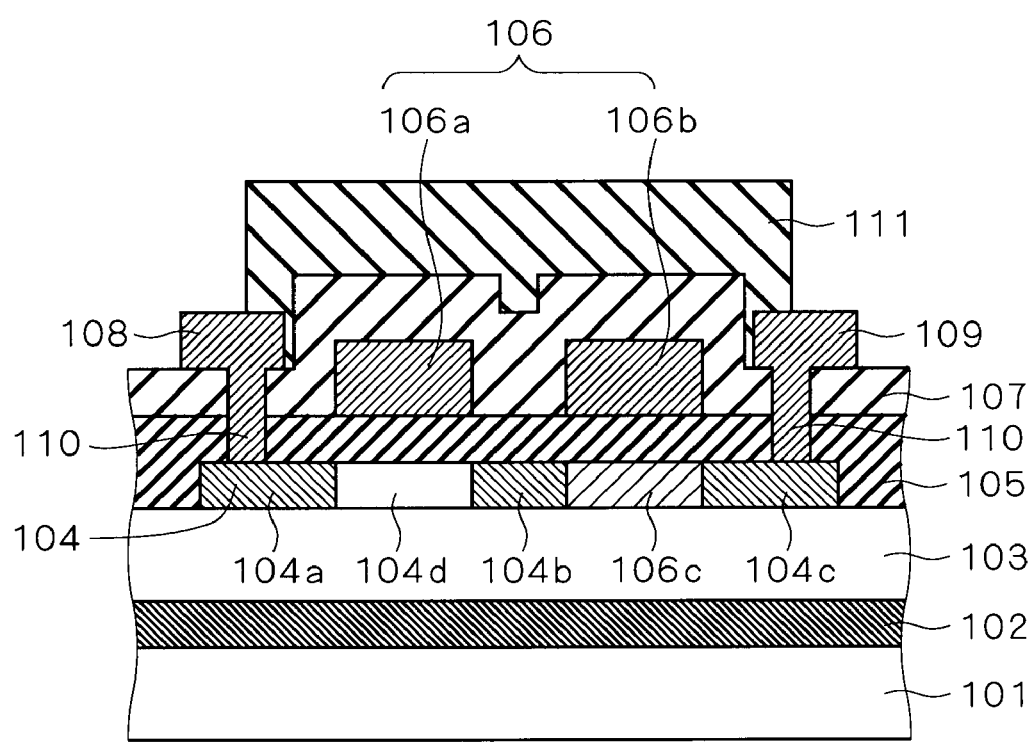
FIG. 10 is a sectional view showing a thin film transistor according to a second preferred embodiment.

FIG. 10 is a sectional view showing a thin film transistor according to the present embodiment. The thin film transistor includes a glass substrate 101. A 100-nm thick silicon nitride (SiN) film 102 and a 200-nm thick silicon oxide film 103 are formed on the glass substrate 101.

A polysilicon film 104 is formed like islands on the silicon oxide film 103. That is, the polysilicon film 104 is a semiconductor layer formed above the glass substrate 101. Formed on the surfaces of the polysilicon film 104 and silicon oxide film 103 is a silicon oxide film 105 serving as a gate insulating film.

A first gate electrode 106a and a second gate electrode 106b, each being made of a chromium film, are formed separately from each other on the surface of the silicon oxide film 105. The first gate electrode 106a and second gate electrode 106b shall have the same gate length, unlike the first preferred embodiment. Although not illustrated, the first gate electrode 106a and second gate electrode 106b are electrically connected to each other in an area except above the polysilicon film 104 in a different section from that shown in FIG. 10.

The polysilicon film 104 includes a source region 104a and a drain region 104c, each being a doped active region, provided in positions between which the first and second gate electrodes 106a and 106b are interposed. The polysilicon film 104 also includes an intermediate region 104b being a doped region interposed between the first and second gate electrodes 106a and 106b. The polysilicon film 104 further includes a portion 104d under the first gate electrode 106a and a portion 106c under the second gate electrode 106b, each serving as the transistor body.

Formed on the first gate electrode 106a, second gate electrode 106b and silicon oxide film 105 is a silicon oxide film 107 serving as an interlayer insulating film. Contact holes 110 are provided to extend through the silicon oxide films 105 and 107 to reach the source region 104a and drain region 104c, respectively. A source electrode 108 and a drain electrode 109, each being made of an aluminum film, are formed on the silicon oxide film 107.

The source electrode 108 and drain electrode 109 are connected to the source region 104a and drain region 104c via plugs in the contact holes 110, respectively. A silicon nitride film 111 serving as a surface protecting film is formed on the silicon oxide film 107 to cover the surface of the silicon oxide film 107 except the area where the source electrode 108 and drain electrode 109 are provided.

Since the first gate electrode 106a and second gate electrode 106b are electrically connected to each other in an area except above the polysilicon film 104 as described above, they may be considered as one gate electrode 106 split into two. Then, the source region 104a and drain region 104c may be considered as the source region and drain region of the one gate electrode 106, respectively.

In other words, since the gate electrode 6 is split into the first gate electrode 106a and second gate electrode 106b, the silicon oxide film 105 serving as a gate insulating film, first gate electrode 106a, body 104d, source region 104a and intermediate region 104b may be considered to constitute the first transistor, while the silicon oxide film 105, second gate electrode 106b, body 106c, drain region 104c and intermediate region 104b may be considered to constitute the second transistor. In the first transistor, the source region 104a and intermediate region 104b may be considered to correspond to the source region and drain region of the first gate electrode 106a, respectively. In the second transistor, the drain region 104c and intermediate region 104b may be considered to correspond to the drain region and source region of the second gate electrode 106b, respectively.

According to the present embodiment, in the polysilicon film 104, the portion 106c under the second gate electrode 106b has an impurity concentration higher than that of the portion 104d under the first gate electrode 106a. In this manner, when the impurity concentration in the body 106c of the second transistor is higher than that in the body 104d of the first transistor, the threshold voltage of the second transistor can easily be made lower than that of the first transistor.

While the first gate electrode 106a and second gate electrode 106b have the same gate length in the present embodiment, they may have different gate lengths.

The method of manufacturing the thin film transistor shown in FIG. 10 will now be described. FIGS. 11 through 19 are diagrams each showing a step of the method of manufacturing the thin film transistor according to the present embodiment.

Figure 11:
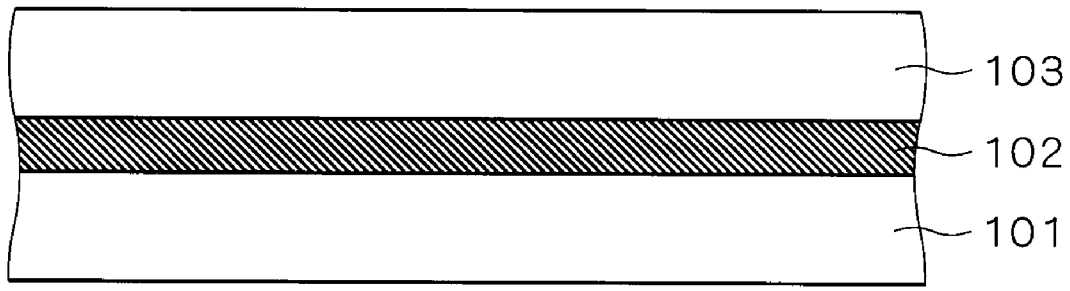
FIGS. 11 through 19 are diagrams each showing a step of the method of manufacturing the thin film transistor according to the second preferred embodiment.

First, as shown in FIG. 11, the silicon nitride film 102 and silicon oxide film 103 are grown in this order, both at least in a thickness of 100 nm, on the glass substrate 101 by plasma vapor deposition. After this deposition, heat treatment such as annealing may be carried out for obtaining improved film properties.

Figure 12:
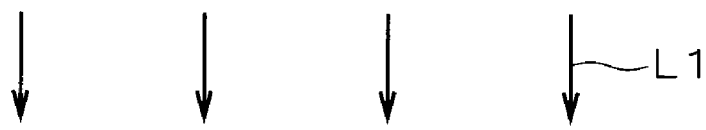
Figure 12:
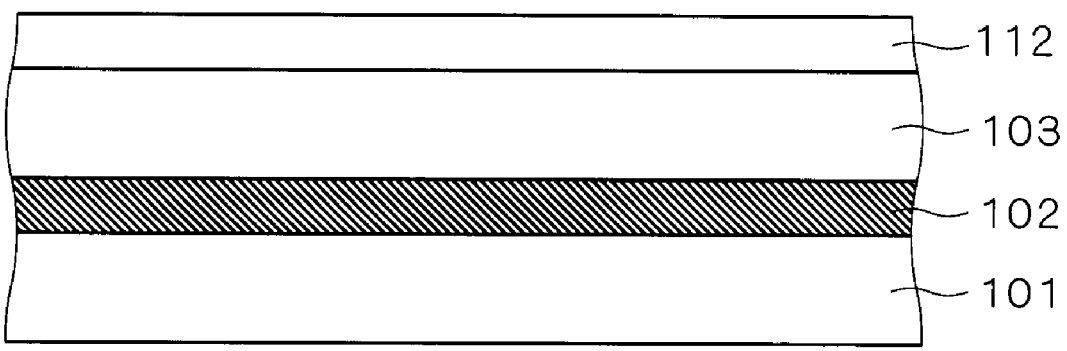

Next, an amorphous silicon film 112 is grown on the silicon oxide film 103 in a thickness of 50 nm by plasma vapor deposition. The deposition may be thermal vapor deposition. Then, as shown in FIG. 12, XeCl excimer laser beams L1 (wavelength: 308 nm) are irradiated to the amorphous silicon film 112. With the irradiation of the laser beams L1, the amorphous silicon film 112 turns into the polysilicon film 104. As a light source of the laser beams L1, the second harmonics (wavelength: 532 nm) of an Nd-doped YAG ($Y_3Al_5O_{12}$) solid pulse laser may be used instead of the XeCl excimer laser beams.

Figure 13:
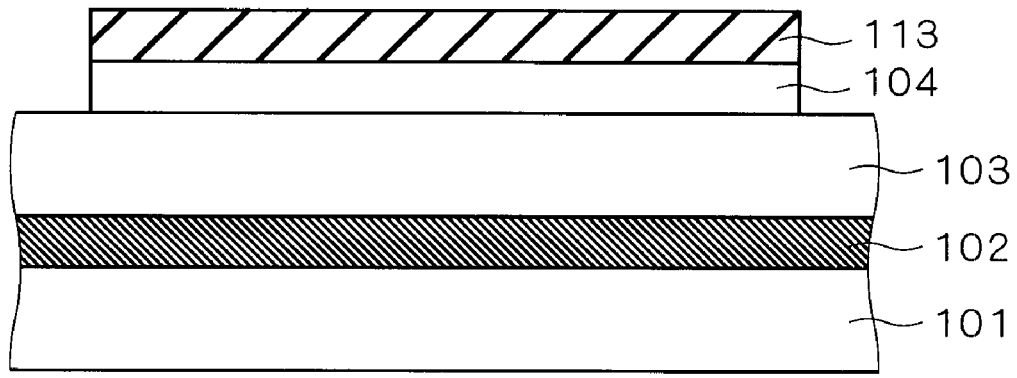

The polysilicon film 104 thus generated is patterned using a resist film 113, and as shown in FIG. 13, etched by dry etching to draw thereon the same configuration as the resist pattern.

Figure 14:
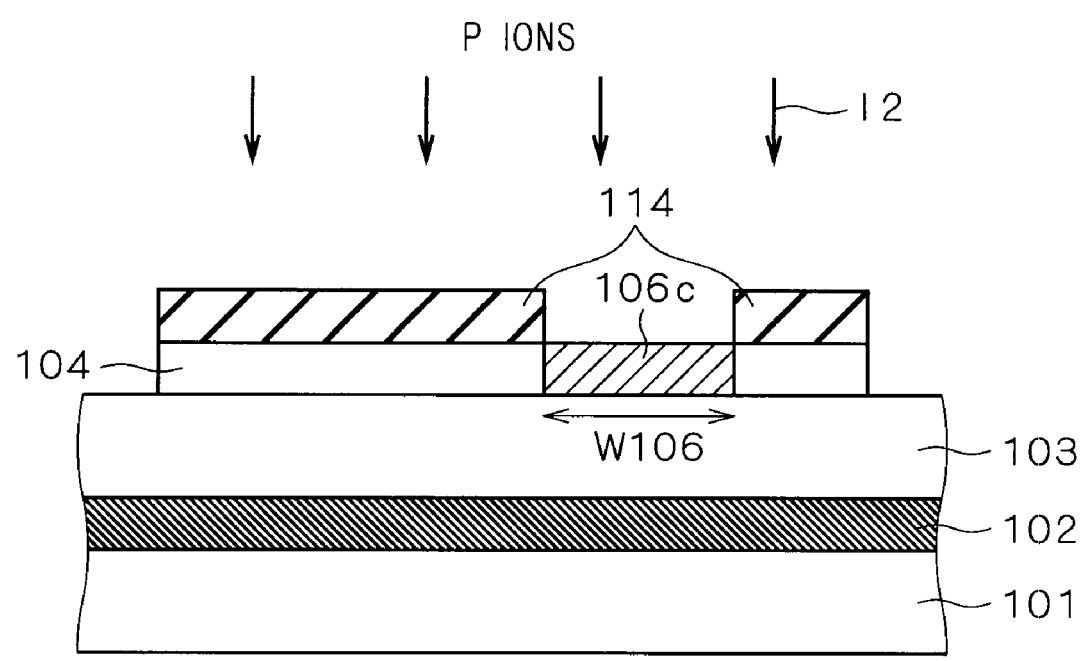

The resist film 113 is then removed, and another resist film 114 is formed. As shown in FIG. 14, an opening having a width W106 wider than the width of the second gate electrode 106b to be formed later is created in the resist film 114 in a position corresponding to the second gate electrode 106b.

Next, impurity implantation 12 is carried out by implanting phosphor (P) ions by an ion accelerator into part of the polysilicon film 104 not covered by the resist film 114. Then, the resist film 114 is removed. The portion 106c having a high impurity concentration is thereby formed in the polysilicon film 104. At this time, implantation at a dose of $10^{12}/cm^2$ or less is preferable because the device will fail to operate normally as a thin film transistor with too many phosphor ions implanted.

While the first and second transistors are assumed to be n-type transistors in the present embodiment, boron (B) ions are used instead of P ions in the impurity implantation 12 when the first and second transistors are p-type transistors. The method of ion implantation may be selected from among plasma doping, ion shower doping and the like, according to necessity. Further, after removing the resist film 114, impurities of the same polarity as or different polarities from those implanted into the portion 106c may further be implanted into the polysilicon film 104 for the purpose of controlling the threshold voltage of the thin film transistor.

The silicon oxide film 105 is then grown in a thickness of 100 nm by plasma vapor deposition. It is preferable to clean the surface of the polysilicon film 104 with nitric acid, fluoric acid or the like before growing the silicon oxide film 105 in terms of increasing cleanliness of the surface of the polysilicon film 104.

Figure 15:
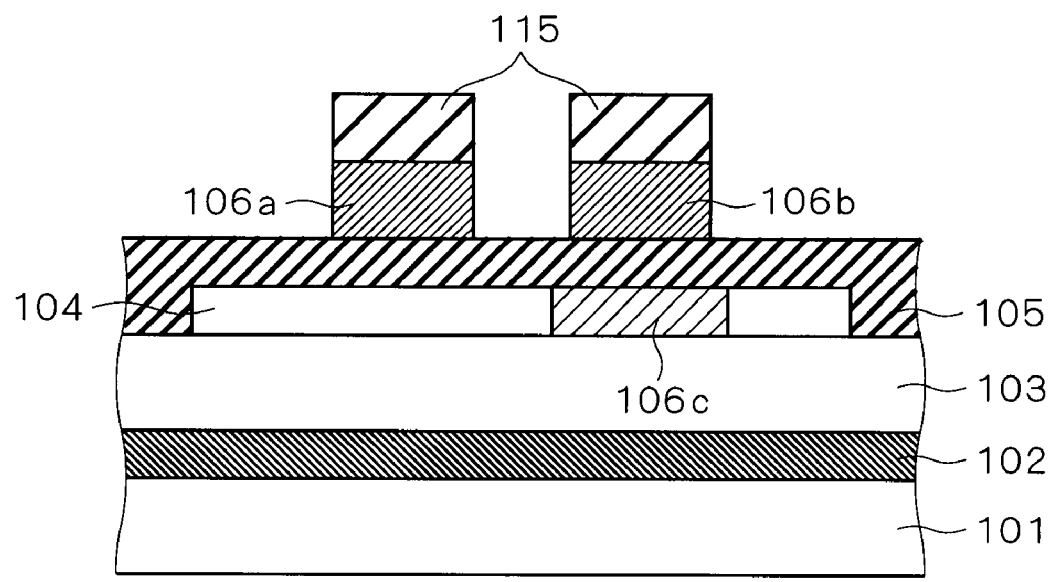

Next, a 200-nm-thick chromium film is deposited by sputtering. At this time, a molybdenum film may be used instead of the chromium film. The chromium film is patterned as shown in FIG. 15 using a resist film 115, and etched, to thereby form the first and second gate electrodes 106a and 106b. As already described, the first and second gate electrodes 106a and 106b shall have the same gate length. The second gate electrode 106b should have a gate length narrower than the width of the portion 106c.

Figure 16:
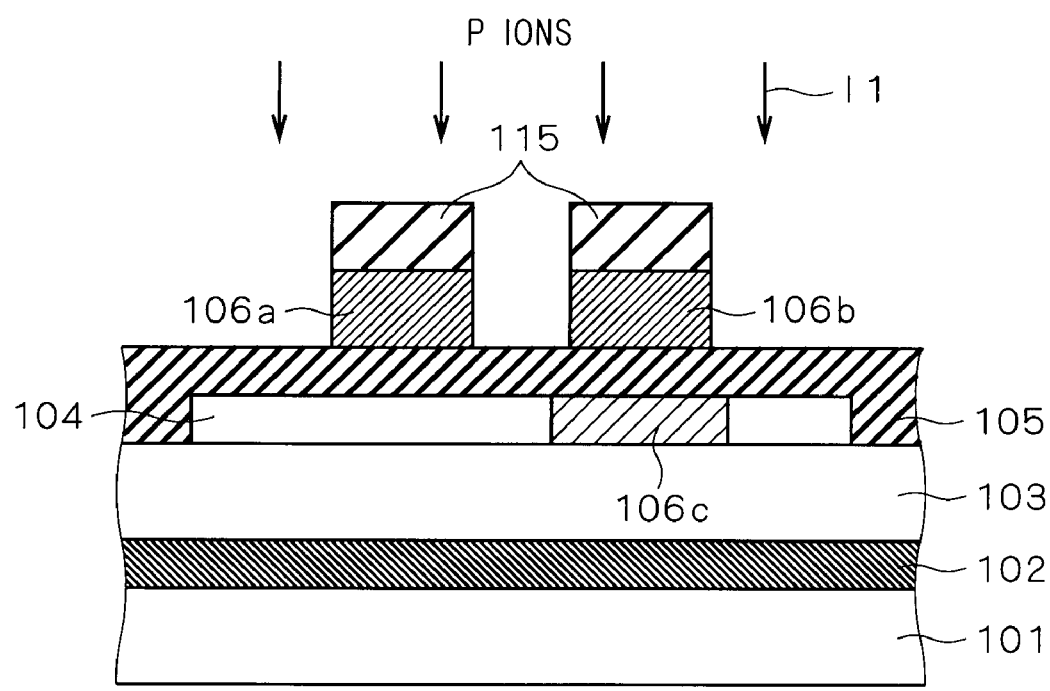

Next, as shown in FIG. 16, impurity implantation 11 is carried out by implanting phosphor (P) ions by an ion accelerator into part of the polysilicon film 104 not covered by the resist film 115 while leaving the resist film 115 unremoved. The source region 104a being a doped active region, intermediate region 104b and drain region 104c are thereby formed in the polysilicon film 104. The portion 104d under the first gate electrode 106a in the polysilicon film 104 and the portion 106c under the second gate electrode 106b in the polysilicon film 104 serve as the bodies of the first and second transistors, respectively.

While the first and second transistors are assumed to be n-type transistors in the present embodiment, boron (B) ions are used instead of P ions in the impurity implantation I1 when the first and second transistors are p-type transistors.

The method of ion implantation may be selected from among plasma doping, ion shower doping and the like, according to necessity.

Figure 17:
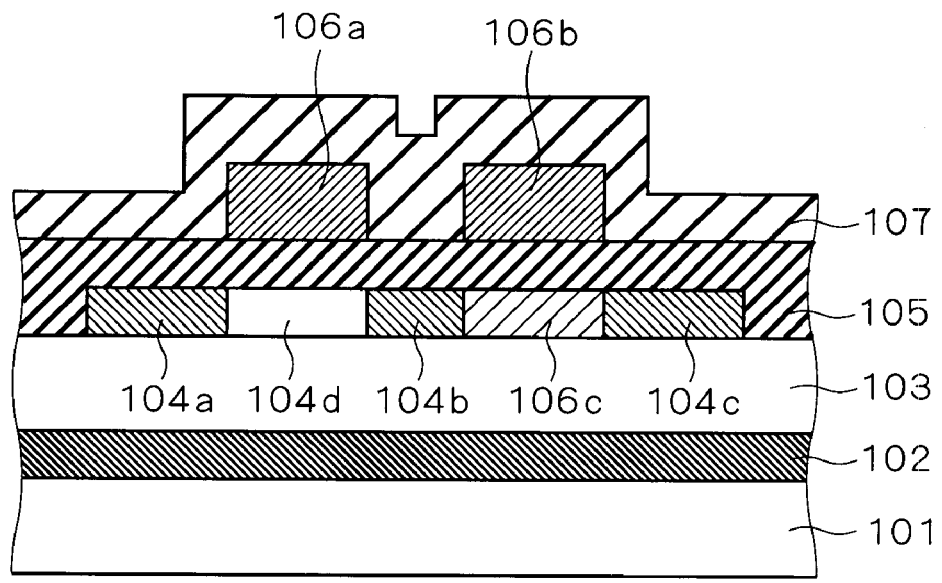

Then, the resist film 115 is removed, and the silicon oxide film 107 is grown in a thickness of 500 nm by plasma vapor deposition as shown in FIG. 17. Thermal annealing is then carried out in order to electrically activate impurity ions as implanted. In the annealing, laser activation may be employed.

Figure 18:
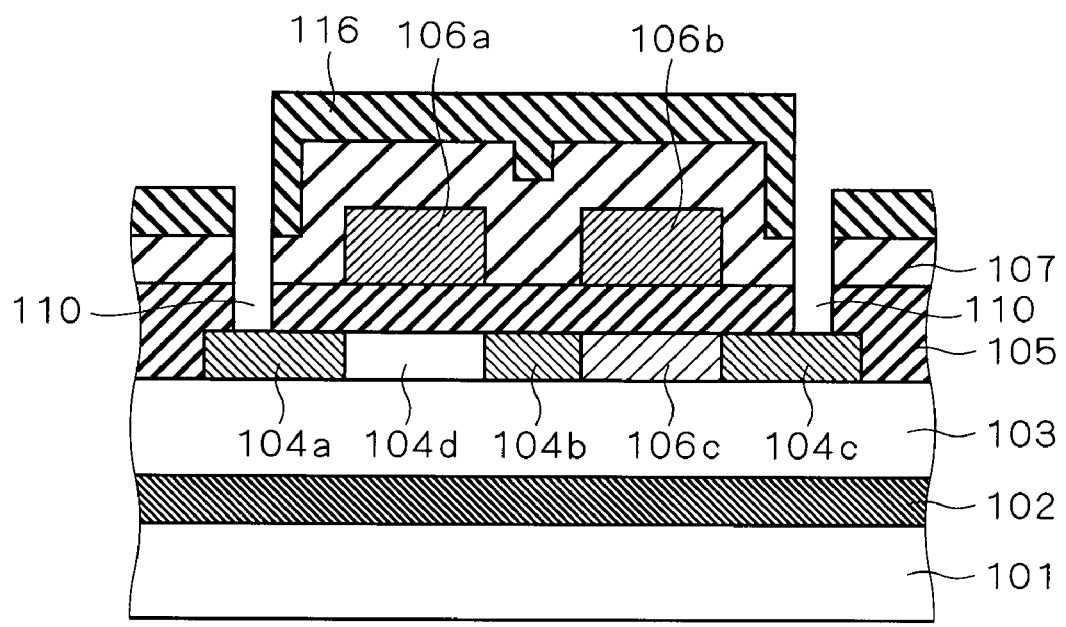
Figure 19:
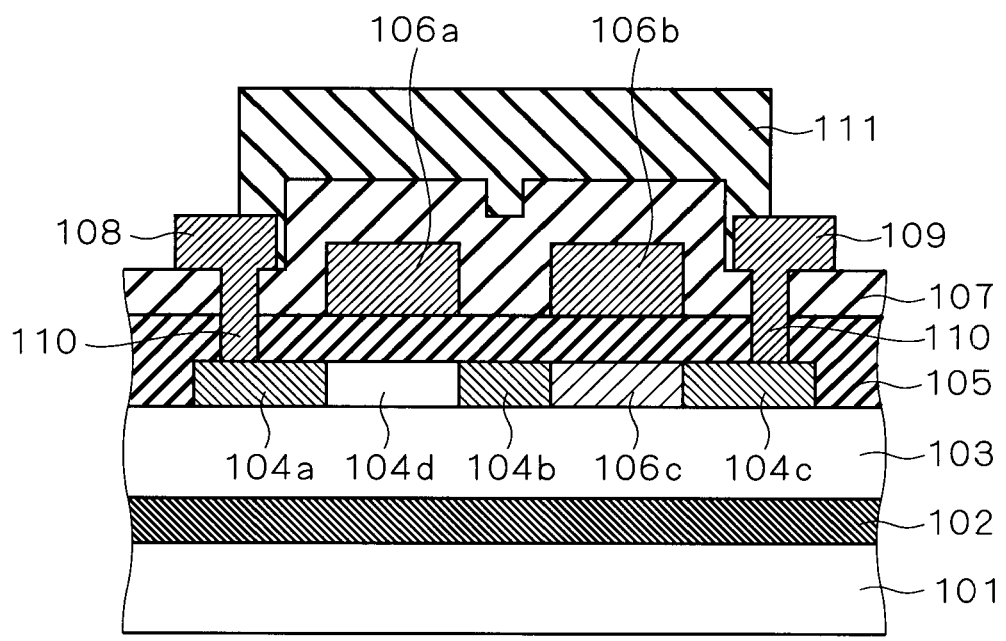

Next, as shown in FIG. 18, a pattern is formed using a resist film 116, and the contact holes 110 are created by etching in the silicon oxide films 105 and 107. At this time, slightly etching the surface of the polysilicon film 104 under the silicon oxide film 105 as well improves the contact properties between the source and drain electrodes which will be described later. The resist film 116 is then removed, and an aluminum film is deposited by sputtering. The aluminum film is patterned using a resist film and etched, to thereby form the source electrode 108 and drain electrode 109.

The resist film is then removed, and the silicon nitride film 111 is grown in a thickness of 200 nm by plasma vapor deposition, and part of the silicon nitride film 111 on the source electrode 108 and drain electrode 109 is removed by etching. Before growing the silicon nitride film 111, the surface of the device structure may be exposed to hydrogen in plasmatic condition in order to correct defects in the polysilicon film 104 to improve electric properties.

The thin film transistor shown in FIG. 10 is manufactured through the above-described steps of the manufacturing method.

In the thin film transistor according to the present embodiment, the body 106c of the second transistor has an impurity concentration higher than that of the body 104d of the first transistor. As a result, the threshold voltage Vthb of the second transistor corresponding to the second gate electrode 106b is lower than the threshold voltage Vtha of the first transistor corresponding to the first gate electrode 106a.

Similarly to the first preferred embodiment, the channel length modulation effect is accordingly reduced to make the saturation current almost constant even when the same voltage is applied to the first and second gate electrodes 106a and 106b, because the transistors corresponding to the respective gate electrodes operate in different conditions. A thin film transistor suitable for an analog circuit which operates in a saturation region and the like is thereby achieved.

Third Preferred Embodiment

The present embodiment is another modification of the thin film transistor according to the first preferred embodiment, in which the threshold voltage of the second transistor is set lower than that of the first transistor by making the first and second transistors differ in crystal defect density at the channel.

Figure 20:
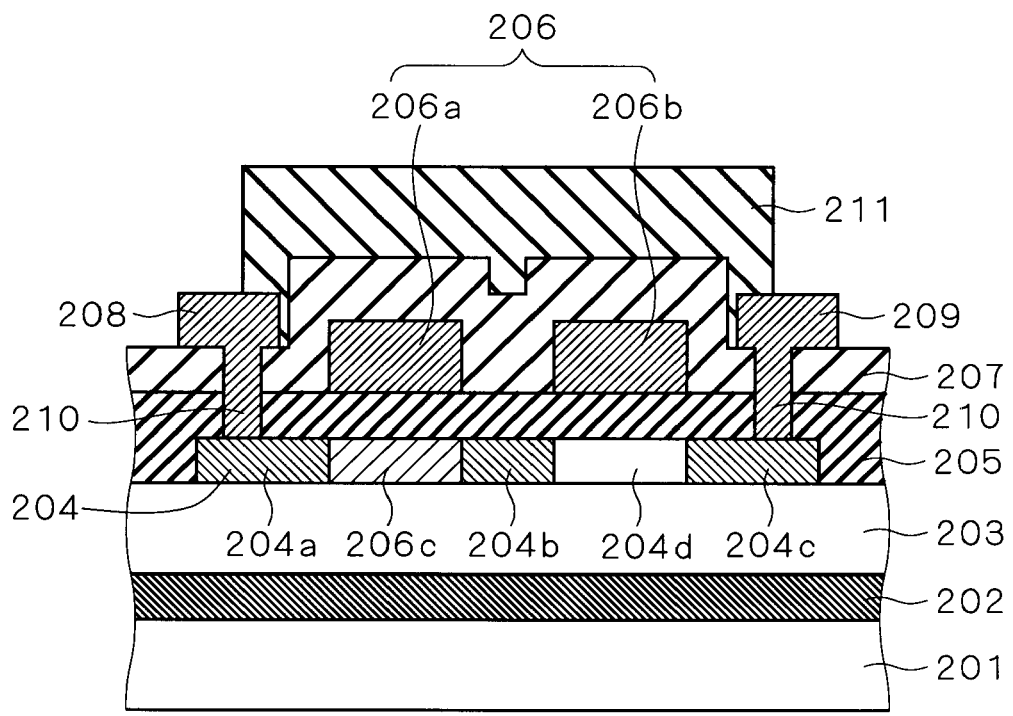
FIG. 20 is a sectional view showing a thin film transistor according to a third preferred embodiment.

FIG. 20 is a sectional view showing a thin film transistor according to the present embodiment. The thin film transistor includes a glass substrate 201. A 100-nm thick silicon nitride film 202 and a 200-nm thick silicon oxide film 203 are formed on the glass substrate 201.

A polysilicon film 204 is formed like islands on the silicon oxide film 203. That is, the polysilicon film 204 is a semiconductor layer formed above the glass substrate 201. Formed on the surfaces of the polysilicon film 204 and silicon oxide film 203 is a silicon oxide film 205 serving as a gate insulating film.

A first gate electrode 206a and a second gate electrode 206b, each being made of a chromium film, are formed separately from each other on the surface of the silicon oxide film 205. The first gate electrode 206a and second gate electrode 206b shall have the same gate length, unlike the first preferred embodiment. Although not illustrated, the first gate electrode 206a and second gate electrode 206b are electrically connected to each other in an area except above the polysilicon film 204 in a different section from that shown in FIG. 20.

The polysilicon film 204 includes a source region 204a and a drain region 204c, each being a doped active region, provided in positions between which the first and second gate electrodes 206a and 206b are interposed. The polysilicon film 204 also includes an intermediate region 204b being a doped region interposed between the first and second gate electrodes 206a and 206b. The polysilicon film 204 further includes a portion 206c under the first gate electrode 206a and a portion 204d under the second gate electrode 206b, each serving as the transistor body.

Formed on the first gate electrode 206a, second gate electrode 206b and silicon oxide film 205 is a silicon oxide film 207 serving as an interlayer insulating film. Contact holes 210 are provided to extend through the silicon oxide films 205 and 207 to reach the source region 204a and drain region 204c, respectively. A source electrode 208 and a drain electrode 209, each being made of an aluminum film, are formed on the silicon oxide film 207.

The source electrode 208 and drain electrode 209 are connected to the source region 204a and drain region 204c via plugs in the contact holes 210, respectively. A silicon nitride film 211 serving as a surface protecting film is formed on the silicon oxide film 207 to cover the surface of the silicon oxide film 207 except the area where the source electrode 208 and drain electrode 209 are provided.

Since the first and second gate electrodes 206a and 206b are electrically connected to each other in the area except above the polysilicon film 204 as described above, they may be considered as one gate electrode 206 split into two. The source region 204a and drain region 204c may be considered as the source region and drain region of the one gate electrode 206, respectively.

In other words, since the gate electrode 206 is split into the first gate electrode 206a and second gate electrode 206b, the silicon oxide film 205 serving as a gate insulating film, first gate electrode 206a, body 206c, source region 204a and intermediate region 204b may be considered to constitute the first transistor, while the silicon oxide film 205, second gate electrode 206b, body 204d, drain region 204c and intermediate region 204b may be considered to constitute the second transistor. In the first transistor, the source region 204a and intermediate region 204b may be considered to correspond to the source region and drain region of the first gate electrode 206a, respectively. In the second transistor, the drain region 204c and intermediate region 204b may be considered to correspond to the drain region and source region of the second gate electrode 206b, respectively.

According to the present embodiment, in the polysilicon film 204, the body 206c under the first gate electrode 206a has a crystal defect density higher than that of the body 204d under the second gate electrode 206b. This results from forming the average grain size in the body 206c under the first gate electrode 206a smaller than that in the body 204d under the second gate electrode 206b in the polysilicon film 204.

In this manner, when the crystal defect density in the body 206c of the first transistor is higher than that in the body 204d of the second transistor, the threshold voltage of the second transistor can easily be made lower than that of the first transistor.

While the first gate electrode 206a and second gate electrode 206b have the same gate length in the present embodiment, they may have different gate lengths.

The method of manufacturing the thin film transistor shown in FIG. 20 will now be described. FIGS. 21 through 30 are diagrams each showing a step of the method of manufacturing the thin film transistor according to the present embodiment.

Figure 21:
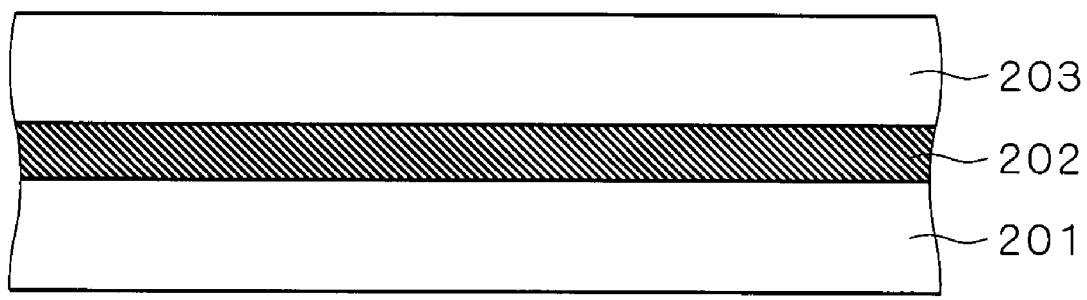
FIGS. 21 through 30 are diagrams each showing a step of the method of manufacturing the thin film transistor according to the third preferred embodiment.

First, as shown in FIG. 21, the silicon nitride film 202 and silicon oxide film 203 are grown in this order, both at least in a thickness of 100 nm, on the glass substrate 201 by plasma vapor deposition. After this deposition, heat treatment such as annealing may be carried out for obtaining improved film properties.

Figure 22:
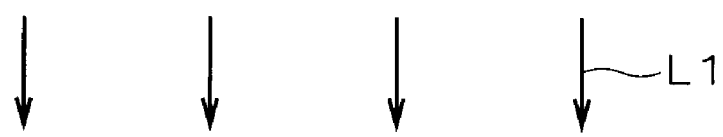
Figure 22:
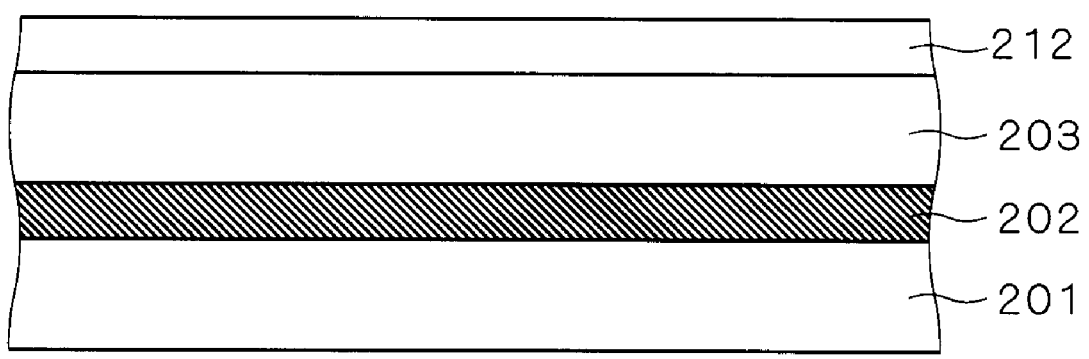

Next, an amorphous silicon film 212 is grown on the silicon oxide film 203 in a thickness of 50 nm by plasma vapor deposition. The deposition may be thermal vapor deposition. Then, as shown in FIG. 22, XeCl excimer laser beams L1 (wavelength: 308 nm) are irradiated to the amorphous silicon film 212. With the irradiation of the laser beams L1, the amorphous silicon film 212 turns into the polysilicon film 204. As a light source of the laser beams L1, the second harmonics (wavelength: 532 nm) of an Nd-doped YAG ($Y_3Al_5O_{12}$) solid pulse laser may be used instead of the XeCl excimer laser beams.

Figure 23:
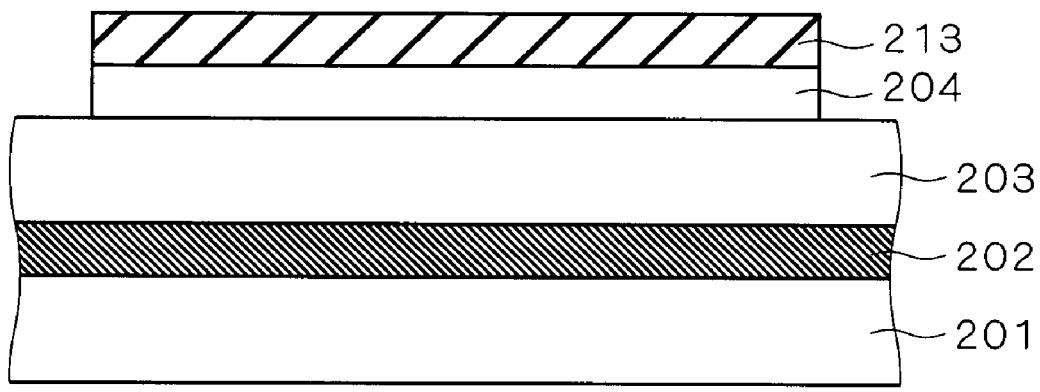

The polysilicon film 204 thus generated is patterned using a resist film 213, and as shown in FIG. 23, etched by dry etching to draw thereon the same configuration as the resist pattern.

Figure 24:
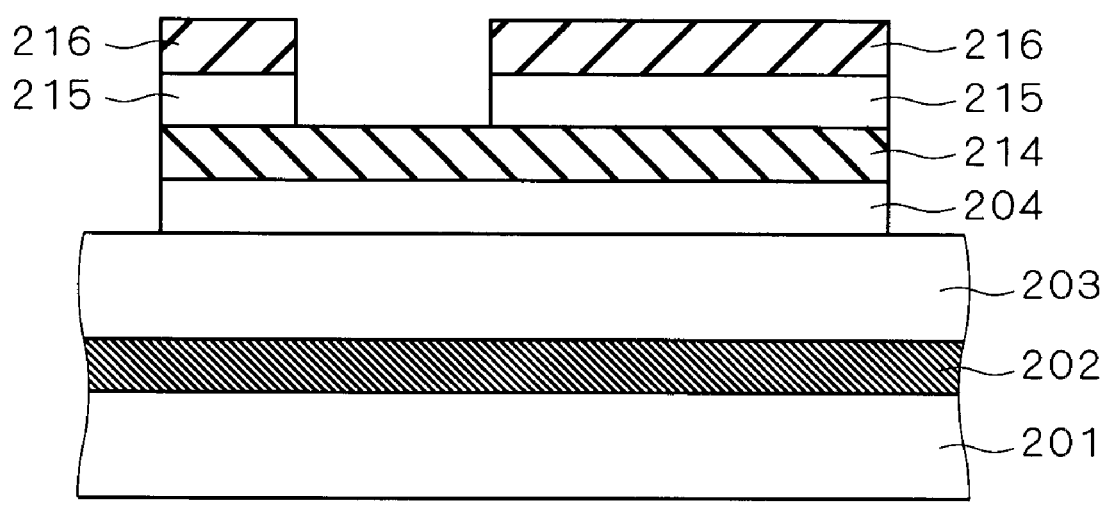

Then, the resist film 213 is removed, and as shown in FIG. 24, a cap layer 214 made of a silicon oxide film is formed on the polysilicon film 204. A light shielding layer 215 made of an amorphous silicon film is further formed on the cap layer 214. The cap layer 214 may be another transparent film that transmits laser beams, such as a silicon nitride film. The light shielding layer 215 may be made of a metal material, such as chromium.

Then, a resist film 216 is formed on the light shielding layer 215, and an opening having a width wider than that of the first gate electrode 206a is created in the resist film 216 in a position corresponding to the first gate electrode 206a to be formed later. Then, the light shielding layer 215 is subjected to etching through the resist film 216 to create an opening of the same pattern in the light shielding layer 215 as shown in FIG. 24.

Figure 25:
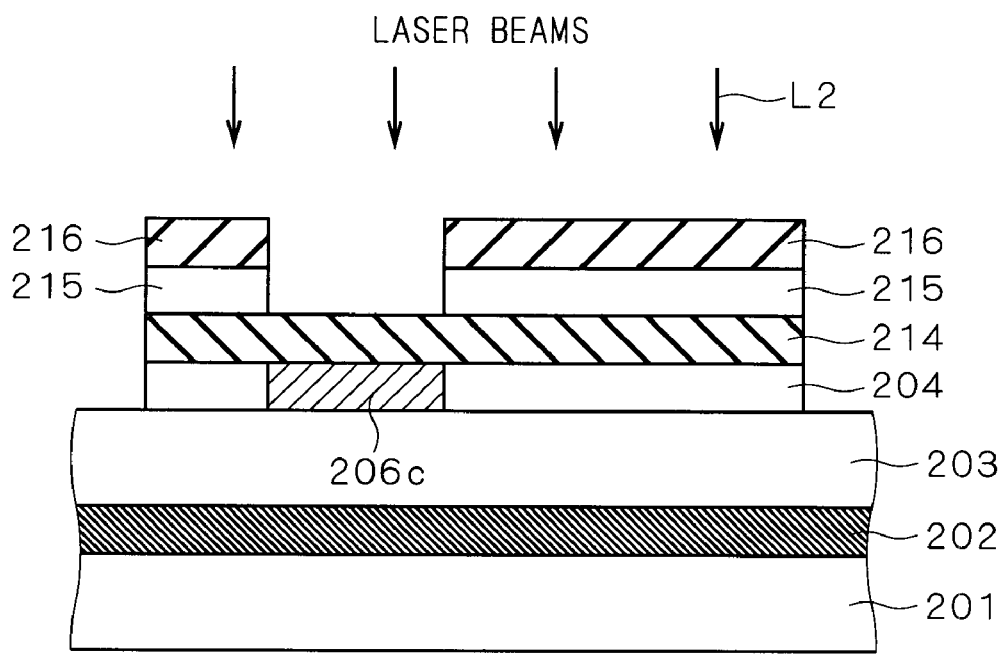

Next, as shown in FIG. 25, XeCl excimer laser beams L2 are irradiated to the polysilicon film 204 through the resist film 216, light shielding layer 215 and cap layer 214, to thereby melt the portion 206c under the first gate electrode 206a in the polysilicon film 204. The XeCl excimer laser beams L2 may have an energy equal to or different from that of the laser beams L1 irradiated to the whole amorphous silicon film 212 as shown in FIG. 22.

At this time, the polysilicon film 204 except the melted portion 206c does not melt since the light shielding layer 215 shields the laser beams L2. The melted portion 206c in the polysilicon film 204 thereafter decreases in temperature to be recrystallized. At this time, crystallization is abruptly started from both the interface between the silicon oxide film 203 and polysilicon film 204 and the interface between the cap layer 214 and polysilicon film 204. Thus, a polysilicon film newly formed in the melted portion 206c has an average grain size smaller than that of the polysilicon film 204 except the portion 206c.

In other words, the average grain size in the portion 206c under the first gate electrode 206a can be made smaller than that in the portion 204d under the second gate electrode 206b in the polysilicon film 204 which is a semiconductor layer. Accordingly, the portion 206c under the first gate electrode 206a has a crystal defect density higher than that of the portion 204d under the second gate electrode 206b.

Next, the resist film 216, light shielding layer 215 and cap layer 214 are removed, and the silicon oxide film 205 is grown in a thickness of 100 nm by plasma vapor deposition. After removing the resist film 216, light shielding layer 215 and cap layer 214, impurities may be introduced into the polysilicon film 204 in order to control the threshold voltage of the thin film transistor. In addition, it is preferable to clean the surface of the polysilicon film 204 with nitric acid, fluoric acid or the like before growing the silicon oxide film 205 in terms of increasing cleanliness of the surface of the polysilicon film 204.

Figure 26:
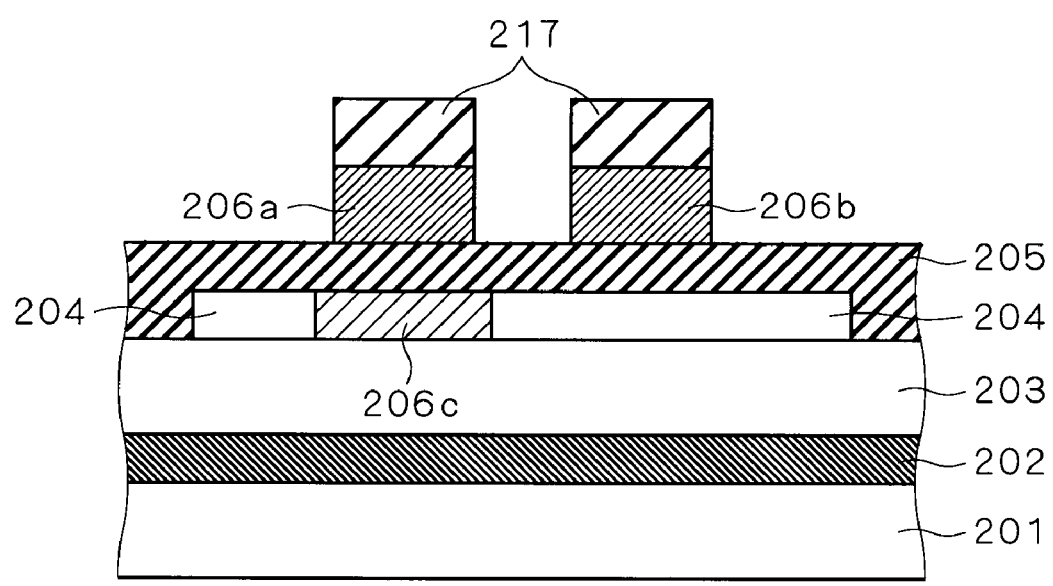

Next, a 200-nm-thick chromium film is deposited by sputtering. At this time, a molybdenum film may be used instead of the chromium film. The chromium film is then patterned as shown in FIG. 26 using a resist film 217, and etched, to thereby form the first and second gate electrodes 206a and 206b. As already described, the first and second gate electrodes 206a and 206b shall have the same gate length; however, the second gate electrode 206b should have a gate length narrower than the width of the portion 206c.

Figure 27:
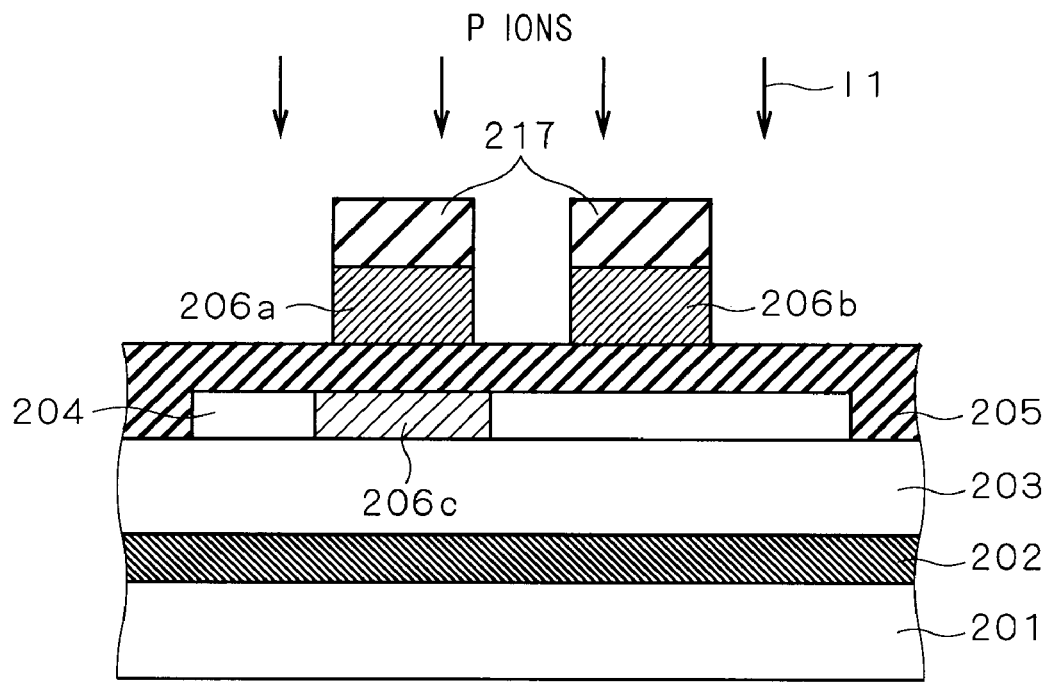

Next, as shown in FIG. 27, impurity implantation I1 is carried out by implanting phosphor (P) ions by an ion accelerator into part of the polysilicon film 204 not covered by the resist film 217 while leaving the resist film 217 unremoved. The source region 204a being a doped active region, intermediate region 204b and drain region 204c are thereby formed in the polysilicon film 204. The portion 206c under the first gate electrode 206a in the polysilicon film 204 and the portion 204d under the second gate electrode 206b in the polysilicon film 204 serve as the bodies of the first and second transistors, respectively.

While the first and second transistors are assumed to be n-type transistors in the present embodiment, boron (B) ions are used instead of P ions in the impurity implantation I1 when the first and second transistors are p-type transistors. The method of ion implantation may be selected from among plasma doping, ion shower doping and the like, according to necessity.

Figure 28:
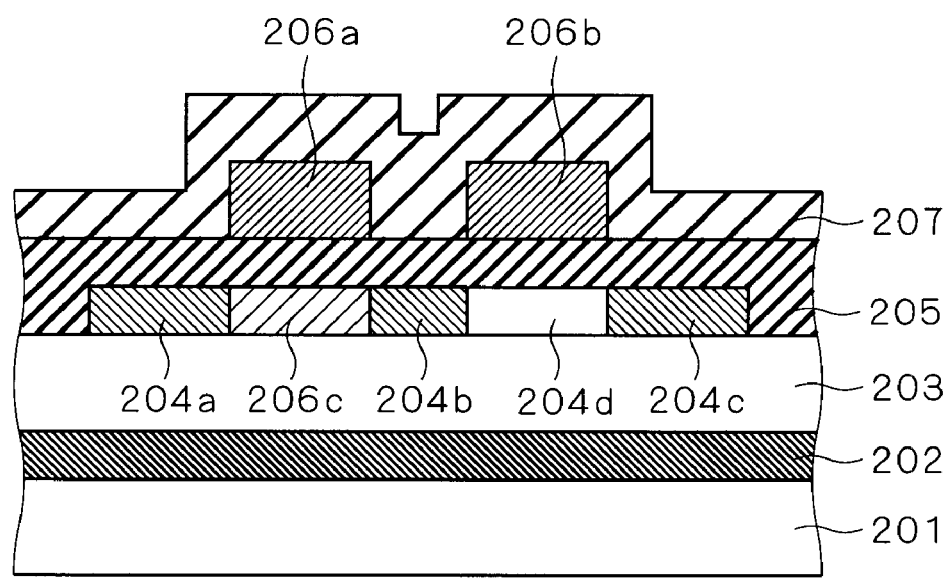

Then, the resist film 217 is removed, and the silicon oxide film 207 is grown in a thickness of 500 nm by plasma vapor deposition as shown in FIG. 28. Thermal annealing is then carried out in order to electrically activate impurity ions as implanted. In the annealing, laser activation may be employed.

Figure 29:
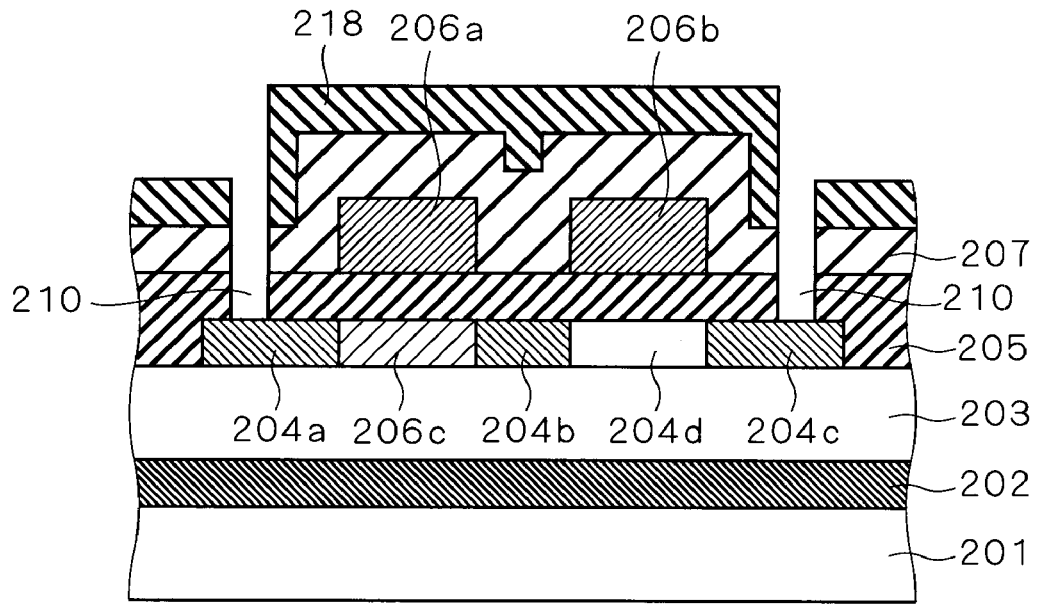
Figure 30:
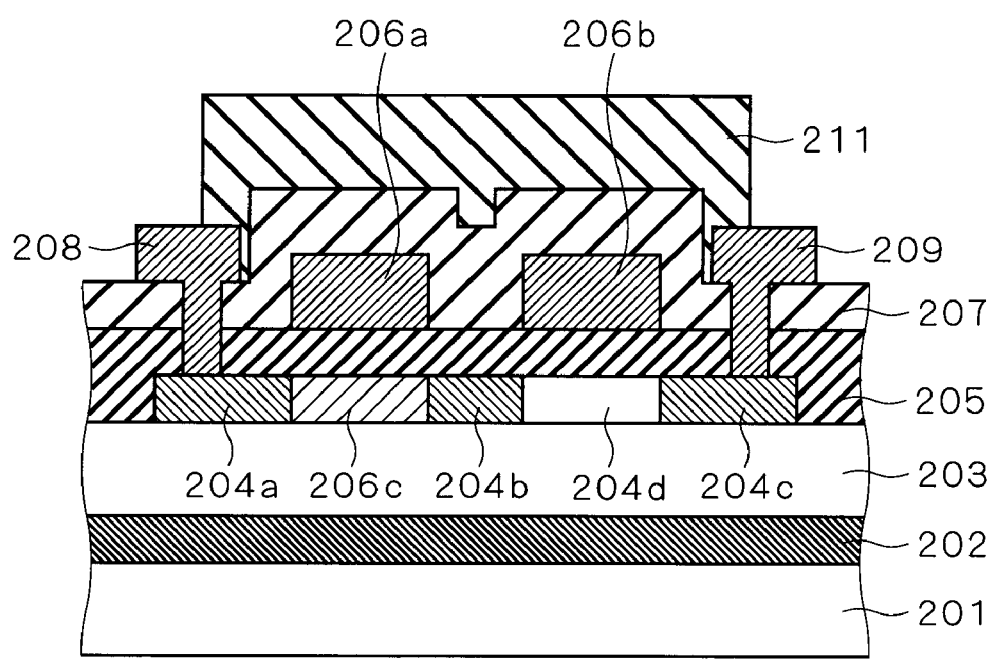

Next, as shown in FIG. 29, a pattern is formed using a resist film 218, and the contact holes 210 are created by etching in the silicon oxide films 205 and 207. At this time, slightly etching the surface of the polysilicon film 204 under the silicon oxide film 205 as well improves the contact properties between the source and drain electrodes which will be described later. The resist film 218 is then removed, and an aluminum film is grown by sputtering. The aluminum film is patterned using a resist film and etched, to thereby form the source electrode 208 and drain electrode 209 as shown in FIG. 30.

The resist film is then removed, and the silicon nitride film 211 is grown in a thickness of 200 nm by plasma vapor deposition. The silicon nitride film 211 on the source electrode 208 and drain electrode 209 is removed by etching. Before growing the silicon nitride film 211, the surface of the device structure may be exposed to hydrogen in plasmatic condition in order to correct defects in the polysilicon film 204 to improve electric properties.

The thin film transistor shown in FIG. 20 is manufactured through the above-described steps of the manufacturing method.

In the thin film transistor according to the present embodiment, the body 206c of the first transistor has an average grain size smaller than that in the body 204d of the second transistor, and accordingly, the body 206c has a crystal defect density higher than that in the body 204d. This allows carriers to be caught in the body 206c more easily than in the body 204d. As a result, the threshold voltage Vtha of the first transistor corresponding to the first gate electrode 206a is higher than the threshold voltage Vthb of the second transistor corresponding to the second gate electrode 206b. In other words, the threshold voltage Vthb of the second transistor corresponding to the second gate electrode 206b is relatively lower than the threshold voltage Vtha of the first transistor corresponding to the first gate electrode 206a.

Similarly to the first preferred embodiment, the channel length modulation effect is accordingly reduced to make the saturation current almost constant even when the same voltage is applied to the first and second gate electrodes 206a and 206b, because the transistors corresponding to the respective gate electrodes operate in different conditions. A thin film transistor suitable for an analog circuit which operates in a saturation region and the like is thereby achieved.

Fourth Preferred Embodiment

The present embodiment will describe a thin film transistor including first and second transistors with the first and second gate electrodes formed separately from each other on the surface of a substrate. The thin film transistor is intended to reduce an electric field concentration at the channel edge on the drain side by making the threshold voltage of the second transistor lower than that of the first transistor.

Figure 31:
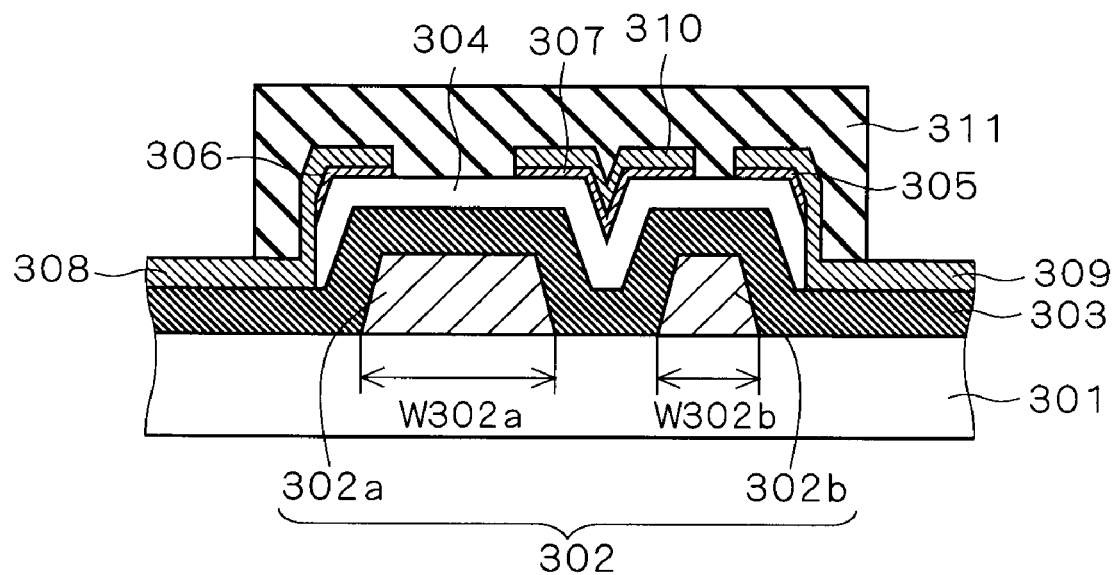
FIG. 31 is a sectional view showing a thin film transistor according to a fourth preferred embodiment.

FIG. 31 is a sectional view showing a thin film transistor according to the present embodiment. The thin film transistor includes a glass substrate 301. A first gate electrode 302a and a second gate electrode 302b, each being made of a chromium film, are formed separately from each other on the surface of the glass substrate 301. Although not illustrated, the first gate electrode 302a and second gate electrode 302b are electrically connected to each other in an area except under a hydrogenated amorphous silicon film 304 which will be described later in a different section from that shown in FIG. 31.

A 200-nm thick silicon nitride film 303 serving as a gate insulating film is formed on the surfaces of the first gate electrode 302a and second gate electrode 302b and the surface of the glass substrate 301. The i(intrinsic)-type hydrogenated amorphous silicon film 304 is formed like islands on the silicon nitride film 303. That is, the hydrogenated amorphous silicon film 304 is a semiconductor layer formed on the surface of the silicon nitride film 303 serving as a gate insulating film.

A source region 306 and a drain region 305, each being made of an n-type hydrogenated amorphous silicon film, are formed electrically separately from each other on the surface of the hydrogenated amorphous silicon film 304 in positions between which the first and second gate electrodes 302a and 302b are interposed. An intermediate region 307 made of an n-type hydrogenated amorphous silicon film is also formed on the surface of the hydrogenated amorphous silicon film 304 to be interposed between the first and second gate electrodes 302a and 302b. In the hydrogenated amorphous silicon film 304, a portion above the first gate electrode 302a and a portion above the second gate electrode 302b each serve as the transistor body.

A source electrode 308, a drain electrode 309 and an intermediate electrode 310, each being made of an aluminum film, are formed on the source region 306, drain region 305 and intermediate region 307, respectively. The source electrode 308, drain electrode 309 and intermediate electrode 310 are connected to the source region 306, drain region 305 and intermediate region 307, respectively. Further, a silicon nitride film 311 serving as a surface protecting film is formed on the source electrode 308, drain electrode 309, intermediate electrode 310 and hydrogenated amorphous silicon film 304.

Since the first gate electrode 302a and second gate electrode 302b are electrically connected to each other in the area except under the hydrogenated amorphous silicon film 304 as described above, they may be considered as one gate electrode 302 split into two. Then, the source region 306 and drain region 305 may be considered as the source region and drain region of the one gate electrode 302, respectively.

In other words, since the gate electrode 302 is split into the first gate electrode 302a and second gate electrode 302b, the silicon nitride film 303 serving as a gate insulating film, first gate electrode 302a, hydrogenated amorphous silicon film 304, source region 306 and intermediate region 307 may be considered to constitute the first transistor, while the silicon nitride film 303, second gate electrode 302b, hydrogenated amorphous silicon film 304, drain region 305 and intermediate region 307 may be considered to constitute the second transistor. In the first transistor, the source region 306 and intermediate region 307 may be considered to correspond to the source region and drain region of the first gate electrode 302a, respectively. In the second transistor, the drain region 305 and intermediate region 307 may be considered to correspond to the drain region and source region of the second gate electrode 302b, respectively.

In the present embodiment, a gate length W302b of the second gate electrode 302b along the line connecting the source region 306 and drain region 305 is set shorter than a gate length W302a of the first gate electrode 302a along the line connecting the source region 306 and drain region 305. Further, in the present embodiment, the gate length W302b of the second gate electrode 302b is set short enough to produce the short channel effect.

In this manner, by making the gate length W302b of the second gate electrode 302b shorter than the gate length W302a of the first gate electrode 302a and short enough to produce the short channel effect, the threshold voltage Vthb of the second transistor corresponding to the second gate electrode 302b can easily be made lower than the threshold voltage Vtha of the first transistor corresponding to the first gate electrode 302a.

Setting the threshold voltage Vthb of the second transistor lower than the threshold voltage Vtha of the first transistor, which means the threshold voltage on the drain side is lower, the on-state resistance at the channel in the semiconductor layer (hydrogenated amorphous silicon film 304) above the second gate electrode 302b is sufficiently low when the same voltage is applied to the first and second gate electrodes 302a and 302b, resulting in a reduction of an electric field concentration at the channel edge on the drain side. This in turn suppresses the occurrence of kink current due to an electric field concentration. The suppression of an electric field concentration also contributes to a reduction of the channel length modulation effect, which in result also reduces fluctuations in saturation current with respect to the drain voltage. A thin film transistor capable of reducing the channel length modulation effect is thereby obtained.

The method of manufacturing the thin film transistor shown in FIG. 31 will now be described. FIGS. 32 through 37 are diagrams each showing a step of the method of manufacturing the thin film transistor according to the present embodiment.

Figure 32:
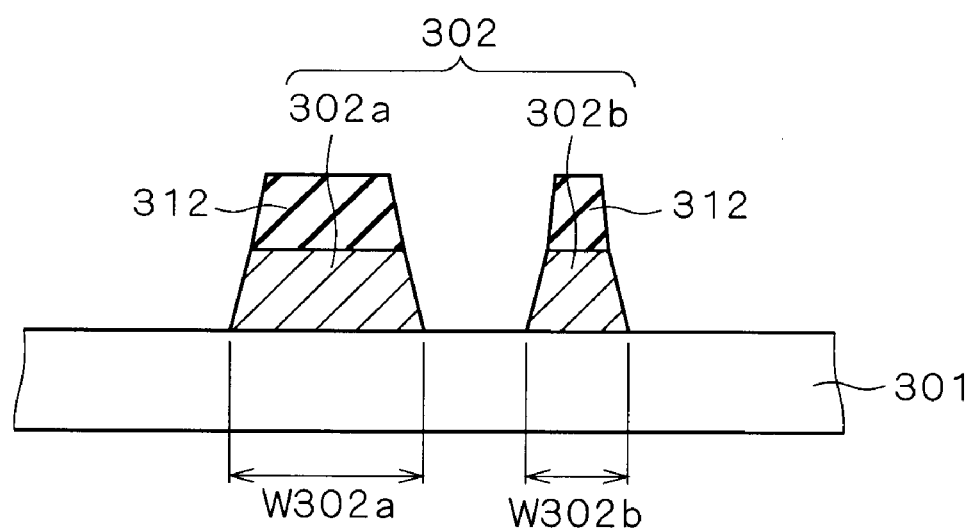
FIGS. 32 through 37 are diagrams each showing a step of the method of manufacturing the thin film transistor according to the fourth preferred embodiment.

First, a 200-nm-thick chromium film is deposited on the glass substrate 301 by sputtering. At this time, a molybdenum film may be used instead of the chromium film. The chromium film is then patterned as shown in FIG. 32 using a resist film 312 and etched, to thereby form the first and second gate electrodes 302a and 302b. As already described, the gate length W302b of the second gate electrode 302b is set shorter than the gate length W302a of the first gate electrode 302a and short enough to produce the short channel effect. The etching may be carried out by taper etching which makes the first and second gate electrodes 302a and 302b each have an obtuse edge angle in cross section.

Figure 33:
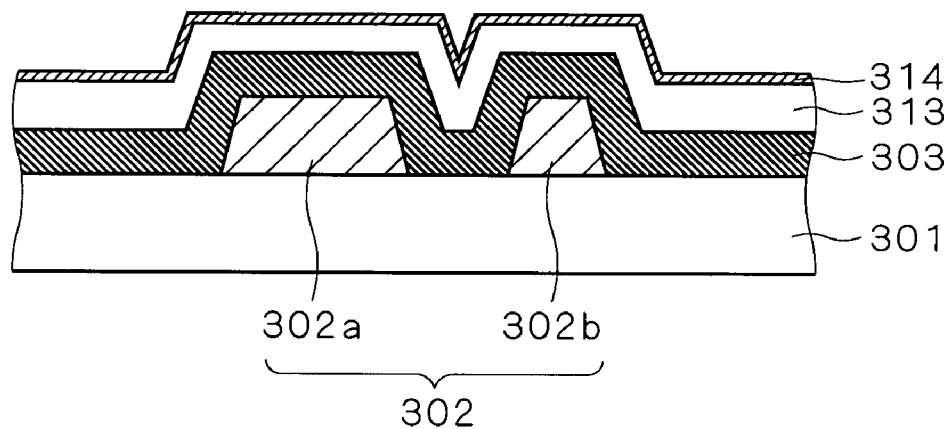

Next, the resist film 312 is removed, and as shown in FIG. 33, the silicon nitride film 303, an i-type hydrogenated amorphous silicon film 313 and an n-type hydrogenated amorphous silicon film 314 are sequentially grown in this order by plasma vapor deposition so as to cover the surfaces of the first and second gate electrodes 302a, 302b and the glass substrate 301. The sequential growth herein means growing the respective films without taking out the glass substrate 301 from a deposition apparatus for use in plasma vapor deposition until deposition of the silicon nitride film 303, i-type hydrogenated amorphous silicon film 313 and n-type hydrogenated amorphous silicon film 314 is completed and without exposing each interface between the respective films to the atmosphere. This allows the interface between the silicon nitride film 303 and hydrogenated amorphous silicon film 313 and the interface between the hydrogenated amorphous silicon film 313 and hydrogenated amorphous silicon film 314 to be kept clean.

Figure 34:
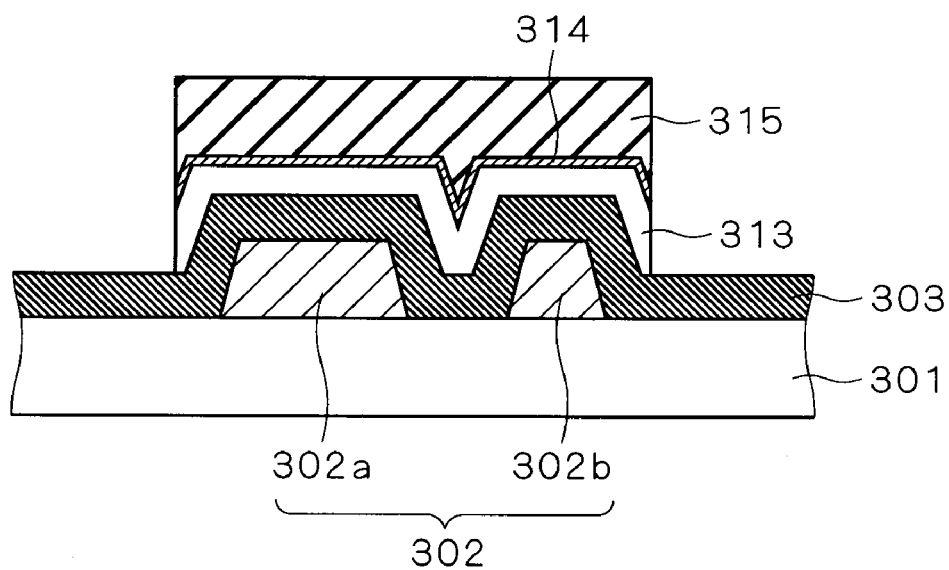

Next, as shown in FIG. 34, the hydrogenated amorphous silicon film 314 is patterned using a resist film 315, and the hydrogenated amorphous silicon film 314 and hydrogenated amorphous silicon film 313 are etched by dry etching. The hydrogenated amorphous silicon film 313 is thereby patterned to be the hydrogenated amorphous silicon film 304 which is a semiconductor layer.

Figure 35:
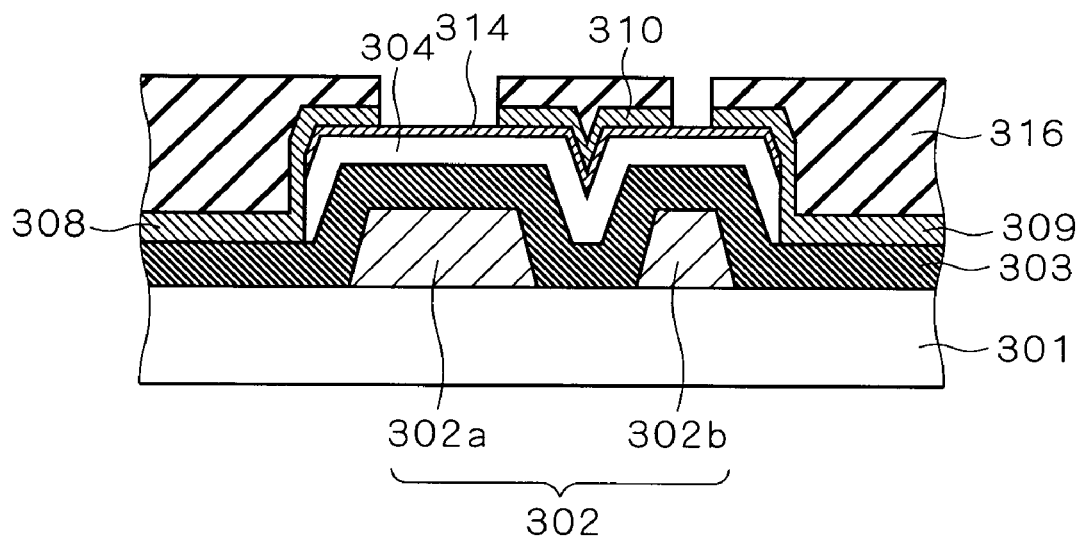

The resist film 315 is then removed, and an aluminum film is deposited by sputtering so as to cover the silicon nitride film 303 and hydrogenated amorphous silicon film 314. The aluminum film preferably has a thickness of not less than 300 nm. Then, as shown in FIG. 35, the aluminum film is patterned using a resist film 316 and etched by wet etching. The source electrode 308, drain electrode 309 and intermediate electrode 310 are thereby formed. When the distance between the first and second gate electrodes 302a and 302b is small, the intermediate electrode 310 may be omitted.

Figure 36:
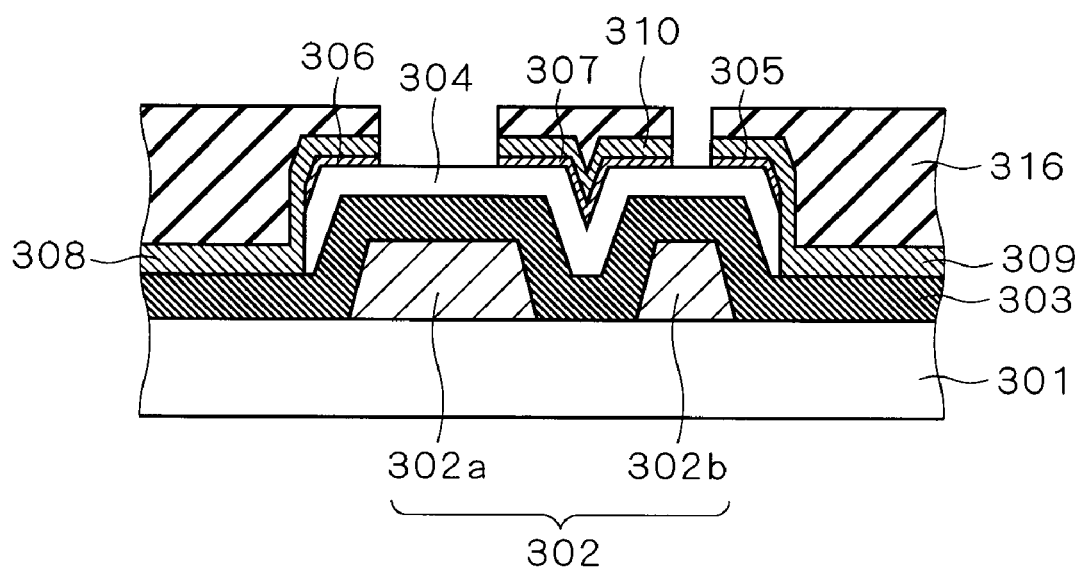

Next, as shown in FIG. 36, the hydrogenated amorphous silicon film 314 is etched by dry etching while leaving the resist film 316 unremoved, to thereby form the drain region 305, source region 306 and intermediate region 307. When the distance between the first and second gate electrodes 302a and 302b is small and the intermediate electrode 310 is omitted accordingly, then, the intermediate region 307 will not exist.

Figure 37:
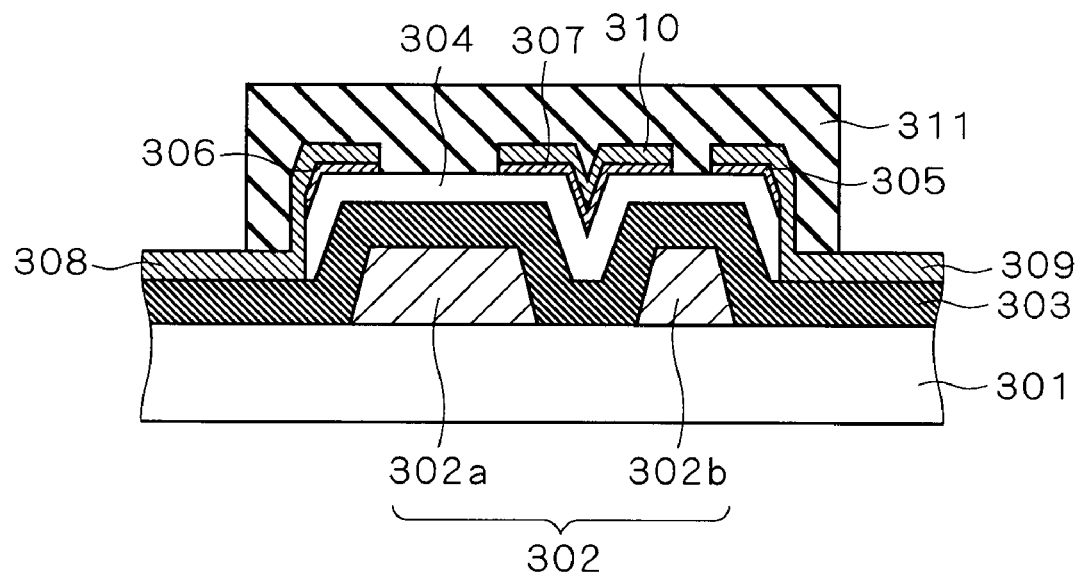

The resist film 316 is then removed, and as shown in FIG. 37, the silicon nitride film 311 is grown in a thickness of 100 nm by plasma vapor deposition. Then, part of the silicon nitride film 311 on the drain electrode 309 and source electrode 308 except above the first and second transistors is removed by etching.

The thin film transistor shown in FIG. 31 is manufactured through the above-described steps of the manufacturing method.

In the thin film transistor according to the present embodiment, the gate length W302b of the second gate electrode 302b is shorter than the gate length W302a of the first gate electrode 302a and short enough to produce the short channel effect. As a result, the threshold voltage Vthb of the second transistor corresponding to the second gate electrode 302b is lower than the threshold voltage Vtha of the first transistor corresponding to the first gate electrode 302a.

Similarly to the first preferred embodiment, the channel length modulation effect is accordingly reduced to make the saturation current almost constant even when the same voltage is applied to the first and second gate electrodes 302a and 302b, because the transistors corresponding to the respective gate electrodes operate in different conditions. A thin film transistor suitable for an analog circuit which operates in a saturation region and the like is thereby achieved.

Fifth Preferred Embodiment

The present embodiment will describe a thin film transistor having a single gate electrode intended to reduce an electric field concentration at the channel edge on the drain side by setting the impurity concentration in a second portion positioned closer to the drain region in a semiconductor layer higher than the impurity concentration in a first portion positioned closer to the source region in the semiconductor layer.

Figure 38:
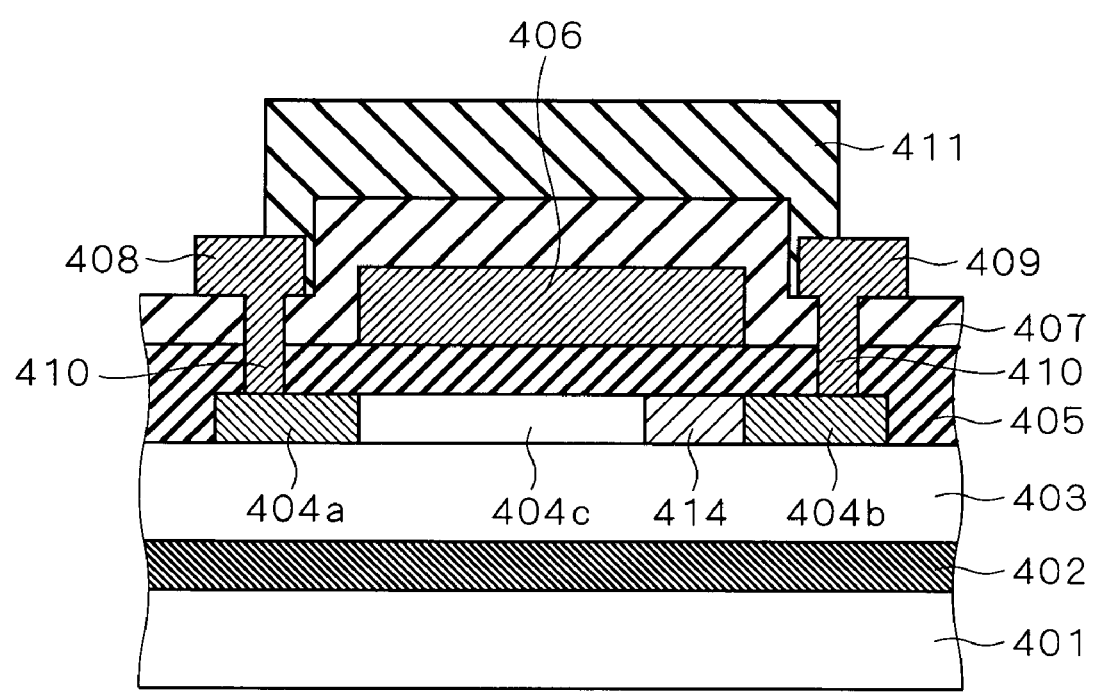
FIG. 38 is a sectional view showing a thin film transistor according to a fifth preferred embodiment.

FIG. 38 is a sectional view showing a thin film transistor according to the present embodiment. The thin film transistor includes a glass substrate 401. A 100-nm thick silicon nitride film 402 and a 200-nm thick silicon oxide film 403 are formed on the glass substrate 401.

A polysilicon film 404 is formed like islands on the silicon oxide film 403. That is, the polysilicon film 404 is a semiconductor layer formed above the glass substrate 401. Formed on the surfaces of the polysilicon film 404 and silicon oxide film 403 is a silicon oxide film 405 serving as a gate insulating film.

A gate electrode 406 made of a chromium film is formed on the surface of the silicon oxide film 405. The polysilicon film 404 includes a source region 404a and a drain region 404b, each being a doped active region, provided in positions between which the gate electrode 406 is interposed. The polysilicon film 404 also includes, under the gate electrode 406, a first portion 404c closer to the source region 404a and a second portion 414 closer to the drain region 404b. The first and second portions 404c and 414 each serve as the transistor body.

Formed on the gate electrode 406 and silicon oxide film 405 is a silicon oxide film 407 serving as an interlayer insulating film. Contact holes 410 are provided to extend through the silicon oxide films 405 and 407 to reach the source region 404a and drain region 404b, respectively. A source electrode 408 and a drain electrode 409, each being made of an aluminum film, are formed on the silicon oxide film 407.

The source electrode 408 and drain electrode 409 are connected to the source region 404a and drain region 404b via plugs in the contact holes 410, respectively. A silicon nitride film 411 serving as a surface protecting film is formed on the silicon oxide film 407 to cover the surface of the silicon oxide film 407 except the area where the source electrode 408 and drain electrode 409 are provided.

In the thin film transistor according to the present embodiment, in the polysilicon film 404 which is a semiconductor layer, the second portion 414 provided closer to the drain region 404b has an impurity concentration higher than that of the first portion 404c provided closer to the source region 404a. The threshold voltage on the drain side is thus lower, sufficiently reducing the on-state resistance at the channel in the second portion 414 when a voltage is applied to the gate electrode 406, which reduces an electric field concentration at the channel edge on the drain side. This in result suppresses the occurrence of kink current due to an electric field concentration. The suppression of an electric field concentration also contributes to a reduction of the channel length modulation effect, which in result also suppresses fluctuations in saturation current with respect to the drain voltage. A thin film transistor capable of reducing the channel length modulation effect is thereby obtained.

The method of manufacturing the thin film transistor shown in FIG. 38 will now be described. FIGS. 39 through 47 are diagrams each showing a step of the method of manufacturing the thin film transistor according to the present embodiment.

Figure 39:
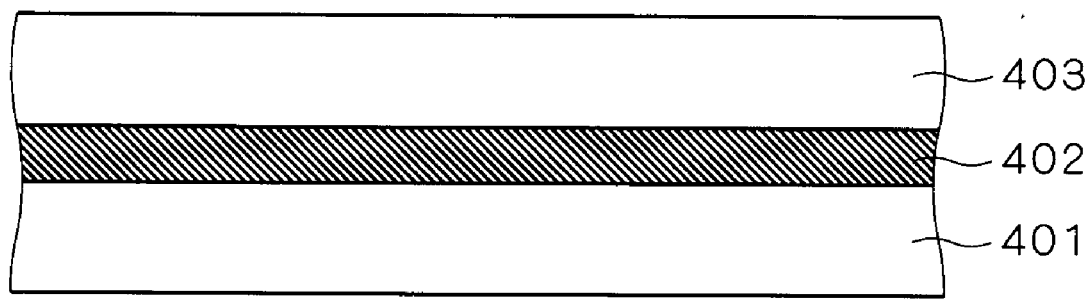
FIGS. 39 through 47 are diagrams each showing a step of the method of manufacturing the thin film transistor according to the fifth preferred embodiment.

First, as shown in FIG. 39, the silicon nitride film 402 and silicon oxide film 403 are grown in this order, both at least in a thickness of 100 nm, on the glass substrate 401 by plasma vapor deposition. After this deposition, heat treatment such as annealing may be carried out for obtaining improved film properties.

Figure 40:
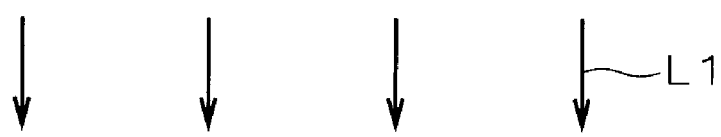
Figure 40:
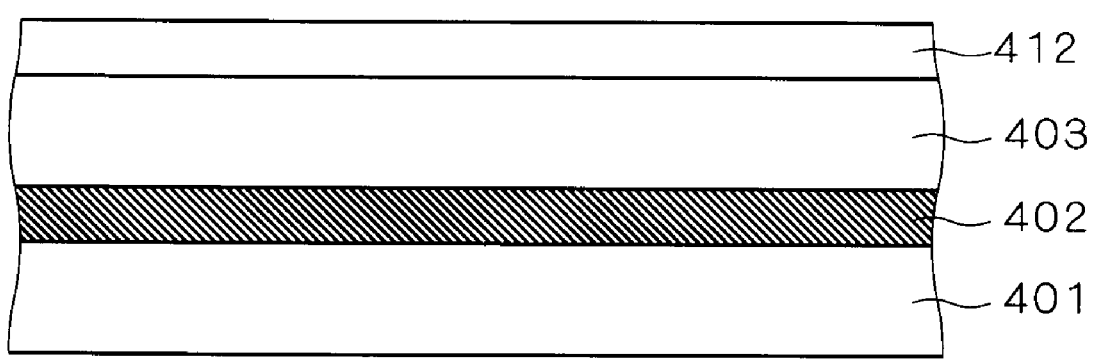

Next, an amorphous silicon film 412 is grown on the silicon oxide film 403 in a thickness of 50 nm by plasma vapor deposition. The deposition may be thermal vapor deposition. Then, as shown in FIG. 40, XeCl excimer laser beams L1 (wavelength: 308 nm) are irradiated to the amorphous silicon film 412. With the irradiation of the laser beams L1, the amorphous silicon film 412 turns into the polysilicon film 404. As a light source of the laser beams L1, the second harmonics (wavelength: 532 nm) of an Nd-doped YAG ($Y_3Al_5O_{12}$) solid pulse laser may be used instead of the XeCl excimer laser beams.

Figure 41:
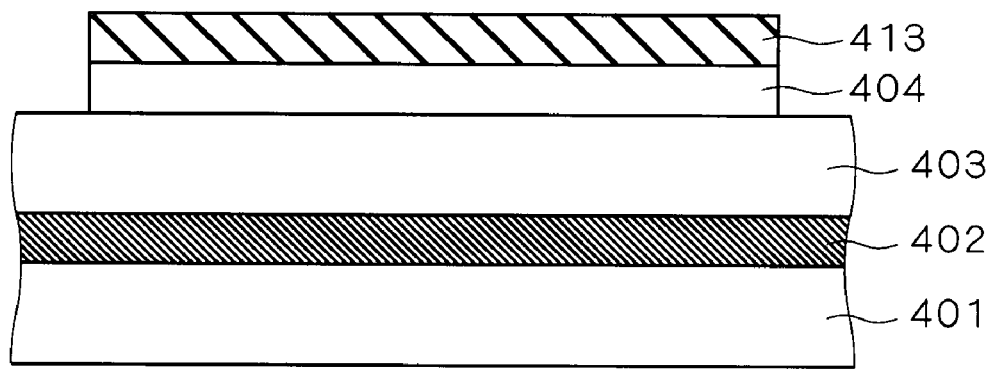

The polysilicon film 404 thus generated is patterned using a resist film 413, and as shown in FIG. 41, etched by dry etching to draw thereon the same configuration as the resist pattern.

Figure 42:
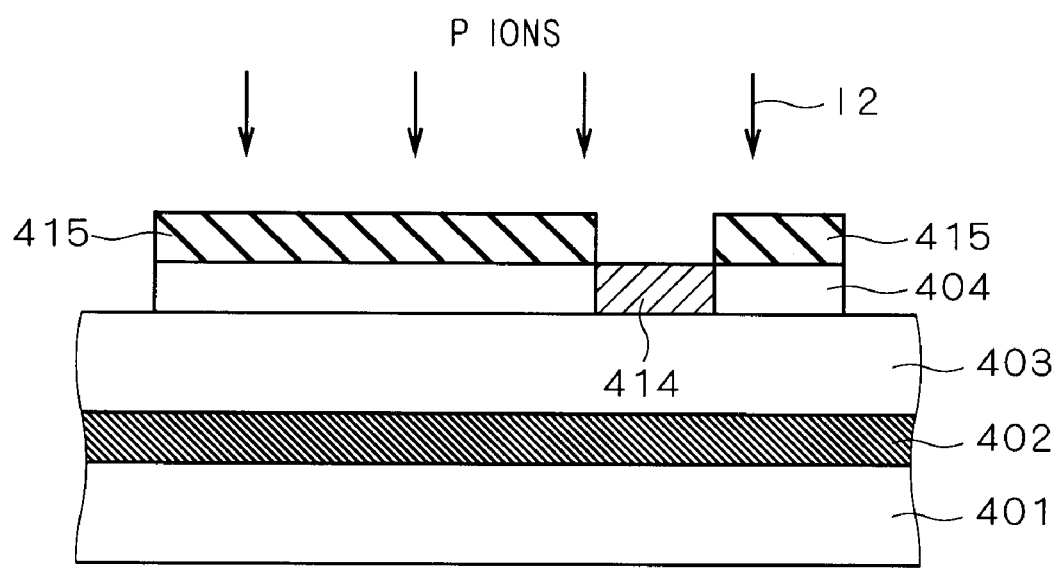

The resist film 413 is then removed, and another resist film 415 is formed. As shown in FIG. 42, an opening is created in the resist film 415 in a position corresponding to the second portion 414 to be formed later. The second portion 414 is defined as a region extending toward the center of the polysilicon film 404 with a certain length from the drain edge of the gate electrode 406.

Next, impurity implantation 12 is carried out by implanting P ions by an ion accelerator into part of the polysilicon film 404 not covered by the resist film 415. Then, the resist film 415 is removed. The second portion 414 having a high impurity concentration is thereby formed in the polysilicon film 404. At this time, implantation at a dose of $10^{12}/cm^2$ or less is preferable because the device will fail to operate normally as a thin film transistor with too many phosphor ions implanted.

While the first and second transistors are assumed to be n-type transistors in the present embodiment, B ions are used instead of P ions in the impurity implantation 12 when the first and second transistors are p-type transistors. The method of ion implantation may be selected from among plasma doping, ion shower doping and the like, according to necessity. Further, after removing the resist film 415, impurities of the same polarity as or different polarities from those implanted into the second portion 414 may further be implanted into the polysilicon film 404 for the purpose of controlling the threshold voltage of the thin film transistor.

The silicon oxide film 405 is then grown in a thickness of 100 nm by plasma vapor deposition. It is preferable to clean the surface of the polysilicon film 404 with nitric acid, fluoric acid or the like before growing the silicon oxide film 405 in terms of increasing cleanliness of the surface of the polysilicon film 404.

Figure 43:
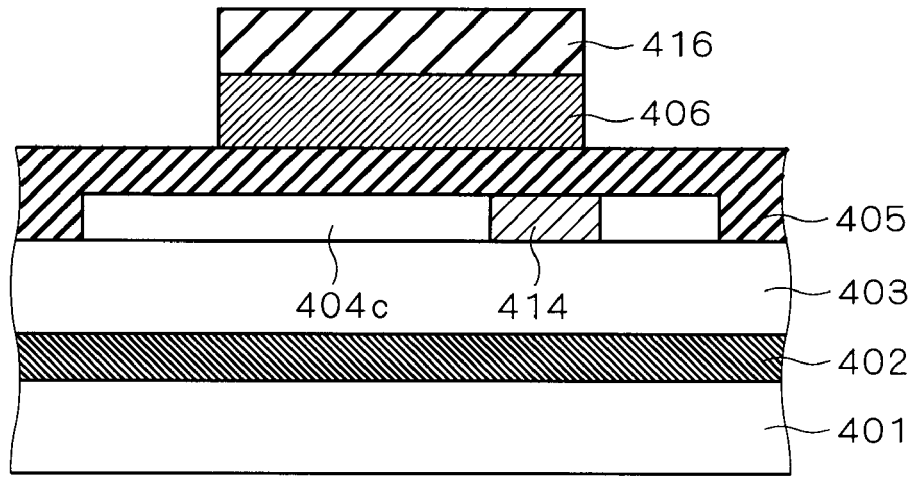

Next, a 200-nm-thick chromium film is deposited by sputtering. At this time, a molybdenum film may be used instead of the chromium film. The chromium film is then patterned as shown in FIG. 43 using a resist film 416, and etched, to thereby form the gate electrode 406. At this time, the gate electrode 406 is formed with its edge on the drain side positioned inward with respect to the edge of the second portion 414 on the drain side.

Figure 44:
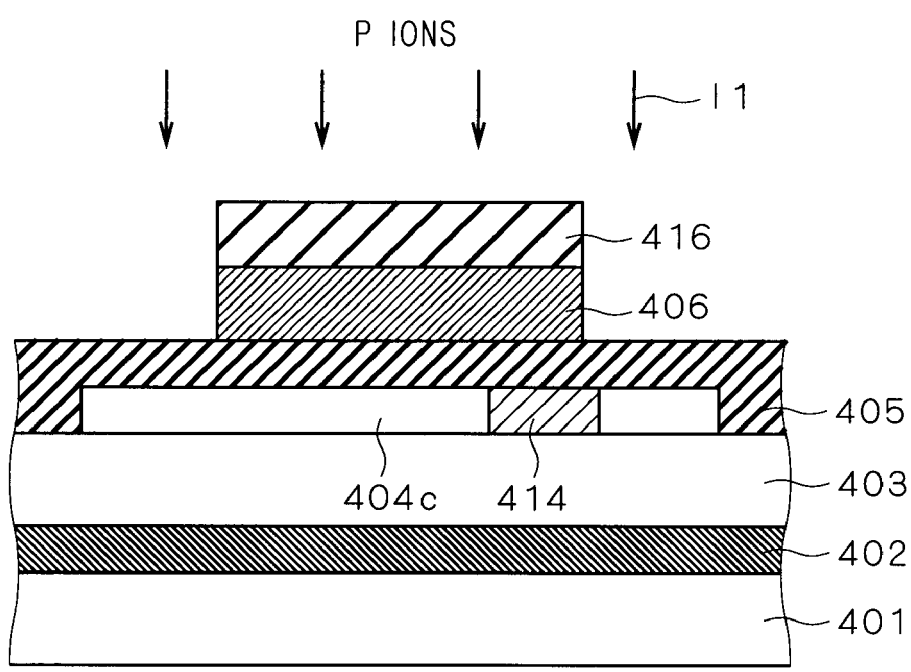

Next, as shown in FIG. 44, impurity implantation 11 is carried out by implanting P ions by an ion accelerator into part of the polysilicon film 404 not covered by the resist film 416 while leaving the resist film 416 unremoved. The source region 404a and drain region 404b, each being a doped active region, are thereby formed in the polysilicon film 404. A portion under the gate electrode 406 in the polysilicon film 404 positioned closer to the source region 404a becomes the first portion 404c. The first and second portions 404c and 414 serve as the bodies of the thin film transistor.

While the thin film transistor of the present embodiment is assumed to be n-type transistors, B ions are used instead of P ions in the impurity implantation I1 when the thin film transistor is a p-type transistor. The method of ion implantation may be selected from among plasma doping, ion shower doping and the like, according to necessity.

Figure 45:
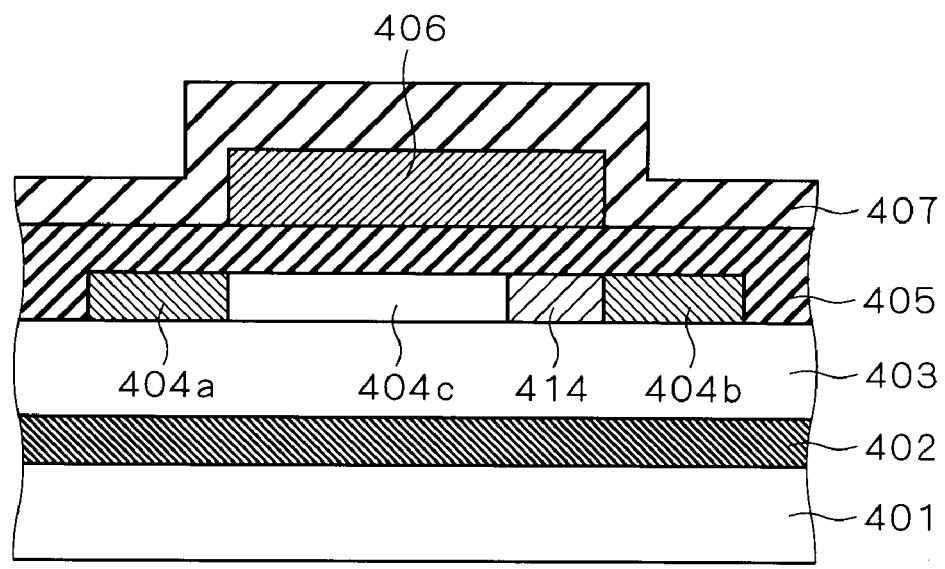

The resist film 416 is then removed, and the silicon oxide film 407 is grown in a thickness of 500 nm by plasma vapor deposition as shown in FIG. 45. Thermal annealing is then carried out in order to electrically activate impurity ions as implanted. In the annealing, laser activation may be employed.

Figure 46:
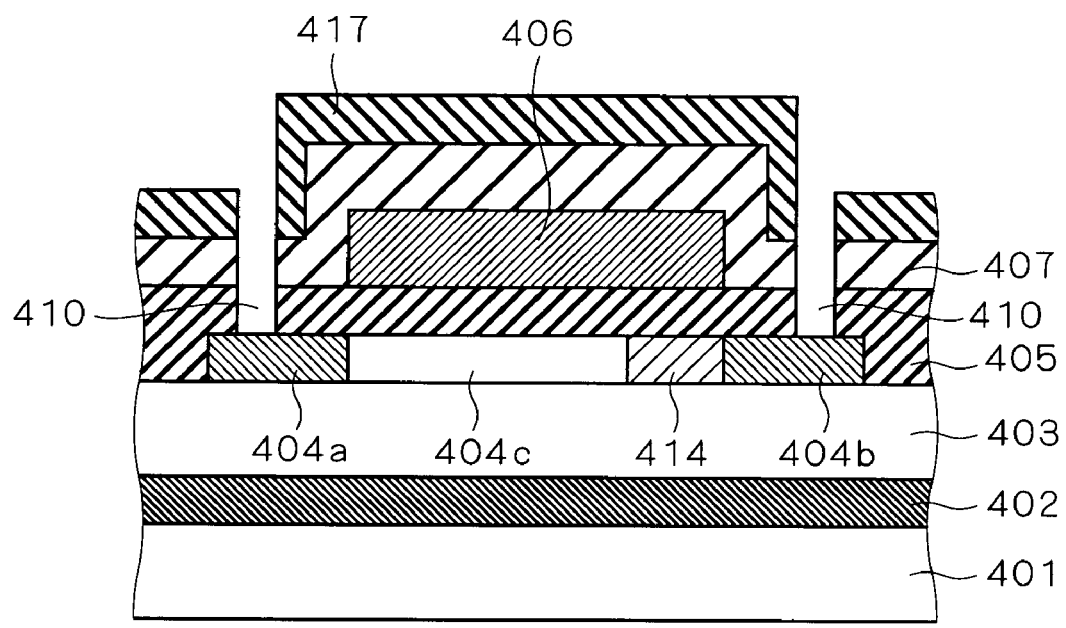
Figure 47:
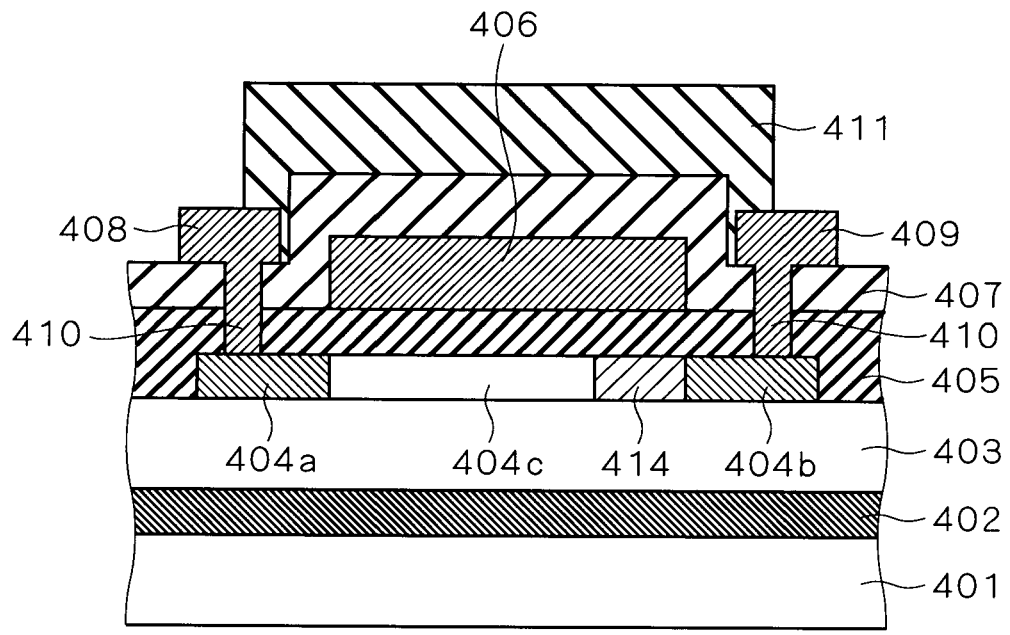

Next, as shown in FIG. 46, a pattern is formed using a resist film 417, and the contact holes 410 are created by etching in the silicon oxide films 405 and 407. At this time, slightly etching the surface of the polysilicon film 404 under the silicon oxide film 405 as well improves the contact properties between the source and drain electrodes which will be described later. The resist film 417 is then removed, and an aluminum film is deposited by sputtering. The aluminum film is patterned using a resist film and etched, to thereby form the source electrode 408 and drain electrode 409, as shown in FIG. 47.

The resist film is then removed, and the silicon nitride film 411 is grown in a thickness of 200 nm by plasma vapor deposition. Part of the silicon nitride film 411 on the source electrode 408 and drain electrode 409 is removed by etching. Before growing the silicon nitride film 411, the surface of the device structure may be exposed to hydrogen in plasmatic condition in order to correct defects in the polysilicon film 404 to improve electric properties.

The thin film transistor shown in FIG. 38 is manufactured through the above-described steps of the manufacturing method.

In the thin film transistor according to the present embodiment, the second portion 414 provided closer to the drain region 404b in the polysilicon film 404 which is a semiconductor layer has an impurity concentration higher than that of the first portion 404c provided closer to the source region 404a. The threshold voltage on the drain side is thus lower, sufficiently reducing the on-state resistance at the channel in the second portion 414 when a voltage is applied to the gate electrode 406, which reduces an electric field concentration at the channel edge on the drain side.

Similarly to the first preferred embodiment, the channel length modulation effect is accordingly reduced to make the saturation current almost constant. A thin film transistor suitable for an analog circuit which operates in a saturation region and the like is thereby achieved.

Sixth Preferred Embodiment

The present embodiment is a modification of the thin film transistor according to the first preferred embodiment, in which the portion under the first gate electrode 6a is made thicker than the portion under the second gate electrode 6b in the gate insulating film in the first preferred embodiment.

Figure 48:
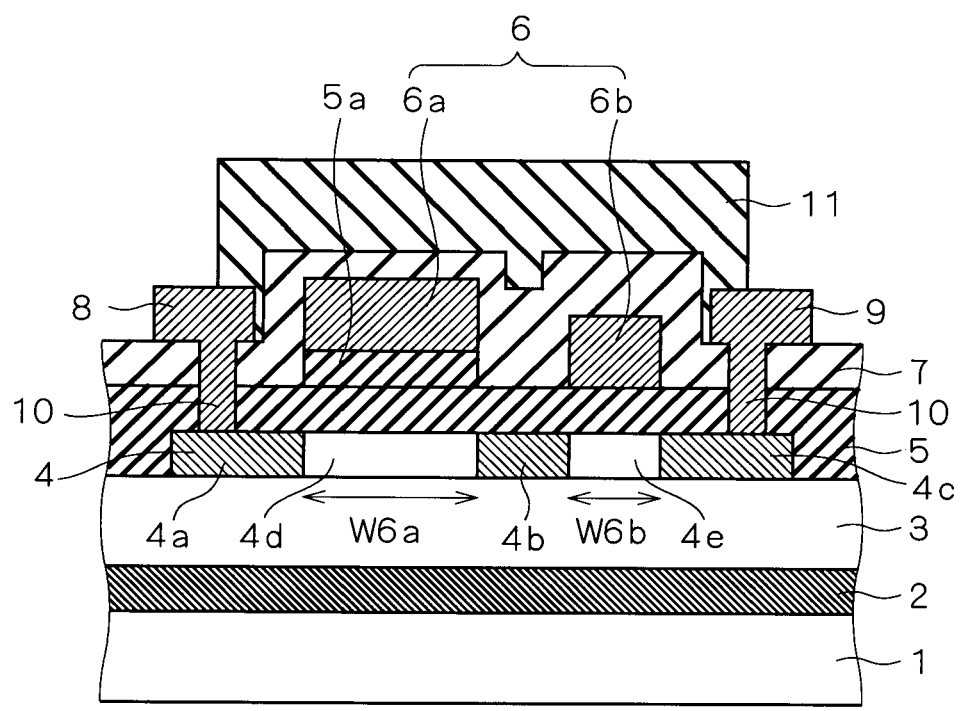
FIG. 48 is a sectional view showing a thin film transistor according to a sixth preferred embodiment.

FIG. 48 is a sectional view showing a thin film transistor according to the present embodiment. The device structure shown in FIG. 48 is the same as that of FIG. 1 except that a silicon oxide film 5a is additionally inserted between the first gate electrode 6a and silicon oxide film 5.

By inserting the silicon oxide film 5a in this manner, the gate insulating film under the first gate electrode 6a is made up of layered films of the silicon oxide films 5 and 5a, so that the thickness of the portion under the first gate electrode 6a in the gate insulating film (i.e., the thickness of layered films of silicon oxide films 5 and 5a) is greater than that of the portion under the second gate electrode 6b in the gate insulating film (i.e., the thickness of silicon oxide film 5 only).

In this manner, by making the portion under the first gate electrode 6a in the gate insulating film thicker than the portion under the second gate electrode 6b in the gate insulating film, the threshold voltage of the second transistor can also easily be made lower than the threshold voltage of the first transistor. This is because the threshold voltage of a transistor depends on the thickness of a gate insulating film.

Other structure is similar to that of the thin film transistor according to the first preferred embodiment, and explanation thereof is omitted here. For forming the silicon oxide film 5a, a new silicon oxide film is grown on the silicon oxide film 5 by plasma vapor deposition after the step shown in FIG. 4 and before the step shown in FIG. 5, and the new silicon oxide film is left by photolithography only in the region where the first gate electrode 6a is to be formed. Then, deposition of the chromium film and patterning follow, to thereby form the first and second gate electrodes 6a and 6b, and processes similar to those in the first preferred embodiment are carried out thereafter.

While the invention has been shown and described in detail, the foregoing description is in all aspects illustrative and not restrictive. It is therefore understood that numerous modifications and variations can be devised without departing from the scope of the invention.

What is claimed is:

1. A single conductivity type MOS thin film multi-gate transistor comprising:

a substrate;

first and second gate electrodes separated from each other on a surface of said substrate;

a gate insulating film on a surface of said substrate and surfaces of said first and second gate electrodes;

a semiconductor layer formed on a surface of said gate insulating film;

a source region and a drain region of a same conductivity type in a surface of said semiconductor layer at positions between which said first and second gate electrodes are interposed;

an intermediate region in said semiconductor layer interposed between said first and second gate electrodes; and an intermediate electrode formed on a surface of said intermediate region, wherein
said gate insulating film, said first gate electrode, said semiconductor layer, said source region and said intermediate region constitute a first transistor,
said gate insulating film, said second gate electrode, said semiconductor layer, said drain region and said intermediate region constitute a second transistor,
said second transistor has a threshold voltage lower than a threshold voltage of said first transistor, and
said semiconductor layer forms a single conductivity type channel for both the first and the second transistors.

2. The single conductivity type MOS thin film multi-gate transistor according to claim 1, wherein
said second gate electrode has a gate length along a line connecting said source region and said drain region shorter than a gate length of said first gate electrode along the line connecting said source region and said drain region, and
said gate length of said second gate electrode is short enough to produce a short channel effect.

3. The single conductivity type MOS thin film multi-gate transistor according to claim 1, wherein
the first and second gate electrodes are electrically connected with each other in an area other than underneath the semiconductor layer.

4. The single conductivity type MOS thin film multi-gate transistor according to claim 1, wherein
the intermediate region includes a downwardly protruding portion that points towards the area between the first and second gate electrodes.

5. The single conductivity type MOS thin film multi-gate transistor according to claim 1, wherein
a length of the second gate electrode along a line connecting the source region and the drain region is set short enough to produce a short channel effect.

6. The single conductivity type MOS thin film multi-gate transistor according to claim 1,
wherein the semiconductor layer is an unitary structure that covers both the first and second gate electrodes.

* * * * *